US010863272B2

(12) United States Patent
Nishiyama et al.

(10) Patent No.: US 10,863,272 B2
(45) Date of Patent: Dec. 8, 2020

(54) SYSTEM IDENTIFICATION DEVICE, SYSTEM IDENTIFICATION METHOD, SYSTEM IDENTIFICATION PROGRAM, AND RECORDING MEDIUM RECORDING SYSTEM IDENTIFICATION PROGRAM

(71) Applicants: NATIONAL UNIVERSITY CORPORATION, IWATE UNIVERSITY, Iwate (JP); RION Co., Ltd., Tokyo (JP)

(72) Inventors: Kiyoshi Nishiyama, Iwate (JP); Masahiro Sunohara, Tokyo (JP); Nobuhiko Hiruma, Tokyo (JP); Chiho Haruta, Tokyo (JP); Makoto Tateno, Tokyo (JP)

(73) Assignees: NATIONAL UNIVERSITY CORPORATION, IWATE UNIVERSITY, Iwate (JP); RION Co., Ltd., Tokyo (JP)

( * ) Notice: Subject to any disclaimer, the term of this patent is extended or adjusted under 35 U.S.C. 154(b) by 0 days.

(21) Appl. No.: 16/418,579

(22) Filed: May 21, 2019

(65) Prior Publication Data

US 2019/0364361 A1  Nov. 28, 2019

(30) Foreign Application Priority Data

May 23, 2018  (JP) ................... 2018-098503

(51) Int. Cl.
*H04R 3/00* (2006.01)
*H04R 3/04* (2006.01)
(Continued)

(52) U.S. Cl.
CPC ............ *H04R 3/04* (2013.01); *G10L 21/0232* (2013.01); *G10L 2021/02082* (2013.01)

(58) Field of Classification Search
CPC .... H04R 2227/007; H04R 3/04; H04R 3/002; G10L 21/02; G10L 2021/02082; H04M 9/082
(Continued)

(56) References Cited

U.S. PATENT DOCUMENTS 6,246,760 B1 * 6/2001 Makino ................. H04M 9/082
                                                    379/406.08
7,039,567 B2    5/2006 Nishiyama
(Continued)

FOREIGN PATENT DOCUMENTS

| JP | 4067269 B2 | 3/2008 |
| JP | 4444919 B2 | 3/2010 |
| JP | 5196653 B2 | 5/2013 |

OTHER PUBLICATIONS

Haykin, S.,"Adaptive Filter Theory," Adaptive Filters Chapter 39, 1996, pp. 628-651, 3rd Edition, Prentice-Hall.
(Continued)

*Primary Examiner* — Disler Paul
(74) *Attorney, Agent, or Firm* — Rankin, Hill & Clark LLP

(57) ABSTRACT

A system identification device for performing fast real-time identification for a system from input/output data includes a filter robust to disturbance, by setting the maximum energy gain from the disturbance to a filter error, as an evaluation criterion, smaller than a given upper limit. The filter estimates a state estimation value of a state of the system.

18 Claims, 13 Drawing Sheets

PRINCIPLE OF ECHO CANCELLER

(51) Int. Cl.
*G10L 21/0232* (2013.01)
*G10L 21/0208* (2013.01)

(58) Field of Classification Search
USPC ...... 381/66, 83, 93, 96; 379/406.01, 406.05, 379/406.08–406.09, 406.12
See application file for complete search history.

(56) References Cited

U.S. PATENT DOCUMENTS

| | | | |
|---|---|---|---|
| 7,480,595 B2 | 1/2009 | Nishiyama | |
| 7,783,032 B2 * | 8/2010 | Abutalebi | G10L 21/0208 379/406.09 |
| 8,380,466 B2 | 2/2013 | Nishiyama | |
| 9,881,630 B2 * | 1/2018 | Buchner | G10L 21/0224 |
| 10,229,698 B1 * | 3/2019 | Chhetri | G10L 21/0208 |
| 10,302,475 B2 * | 5/2019 | Doornebosch | G01F 1/6847 |
| 2015/0256929 A1 * | 9/2015 | Ikram | H04M 3/00 381/66 |

OTHER PUBLICATIONS

Nishiyama, K., "Derivation of a Fast Algorithm of Modified H∞ Filters," Proceedings of IEEE International Conference on Industrial Electronics, Control and Instrumentation, 2000, pp. 462-467, RBC-II; U.S.A.

Nishiyama, K., "An H∞ Optimization and Its Fast Algorithm for Time-Variant System Identification," IEEE Transactions; on Signal Processing, May 2004, pp. 1535-1342, vol. 52 No. 5, IEEE, U.S.A.

Nishiyama, K., "A Unified View of Adaptive Algorithms for Finite Impulse Response Filters using the H∞ Framework," Signal Processing, Apr. 2014, pp. 55-64, vol. 97, Elsevier B.V., The Netherlands.

Hassibi, B. et al., "Indefinite-Quadratic Estimation and Control," Finite-Horizon H∞ Filtering Chapter 4, 1999, pp. 81-107, 1st Edition, SIAM.

Glentis, G.O. et al, "Efficient least squares adaptive algorithms for FIR transversal filtering," IEEE Signal Processing Magazine, Jul. 1999, pp. 13-41 vol. 16, No. 4, IEEE, U.S.A.

Vishiyama, K., "A computationally reduced version of the fast H∞ filter," Automatica, 2018, pp. 249-253, vol. 92, Elsevier Ltd., Jordan.

* cited by examiner

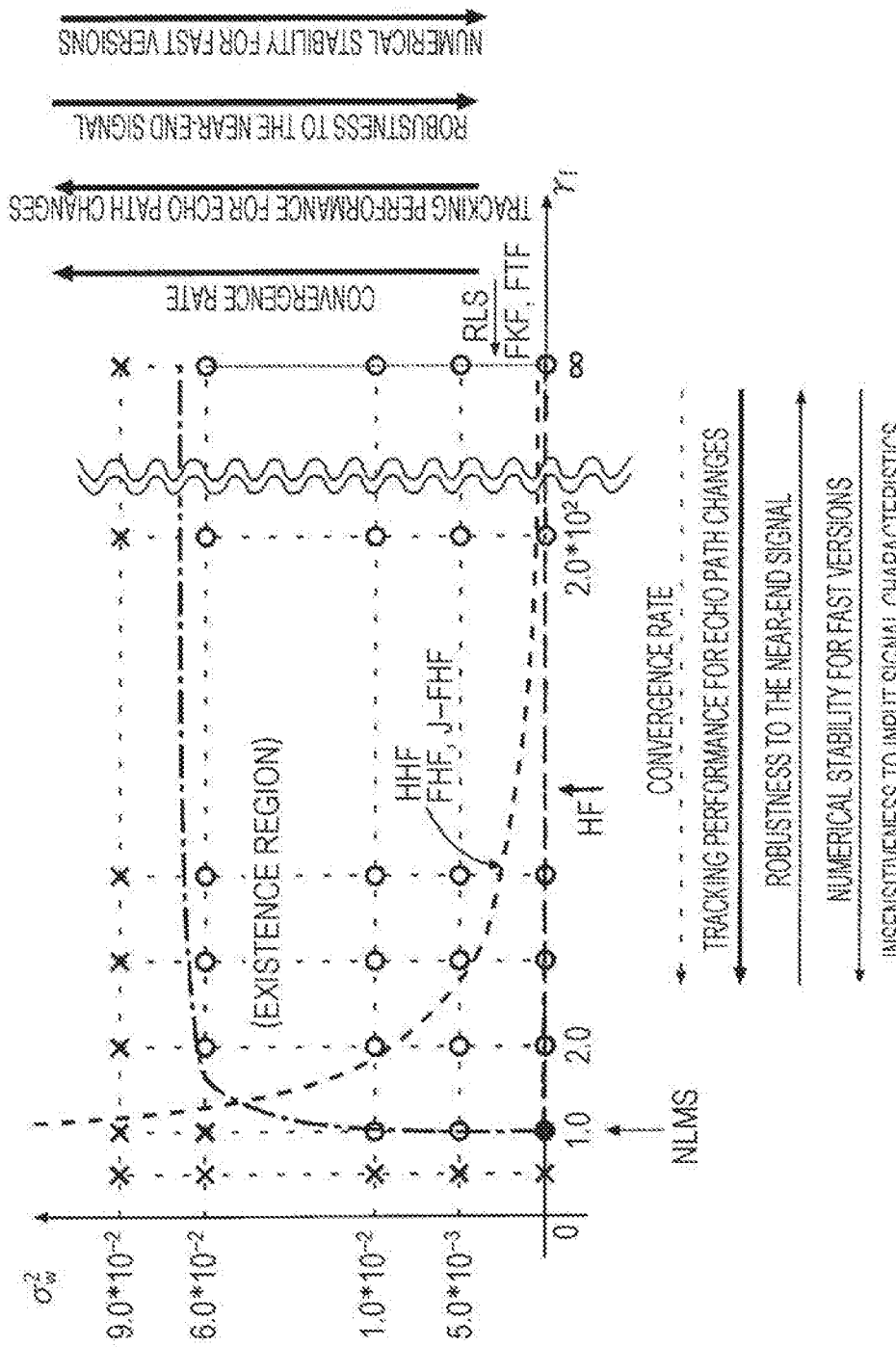
FIG. 1: DISTRIBUTION AND PROPERTIES OF SOLUTION IN $\gamma_f$-$\sigma_w^2$ SPACE; $\rho = 1/(1+\sigma_w^2)$

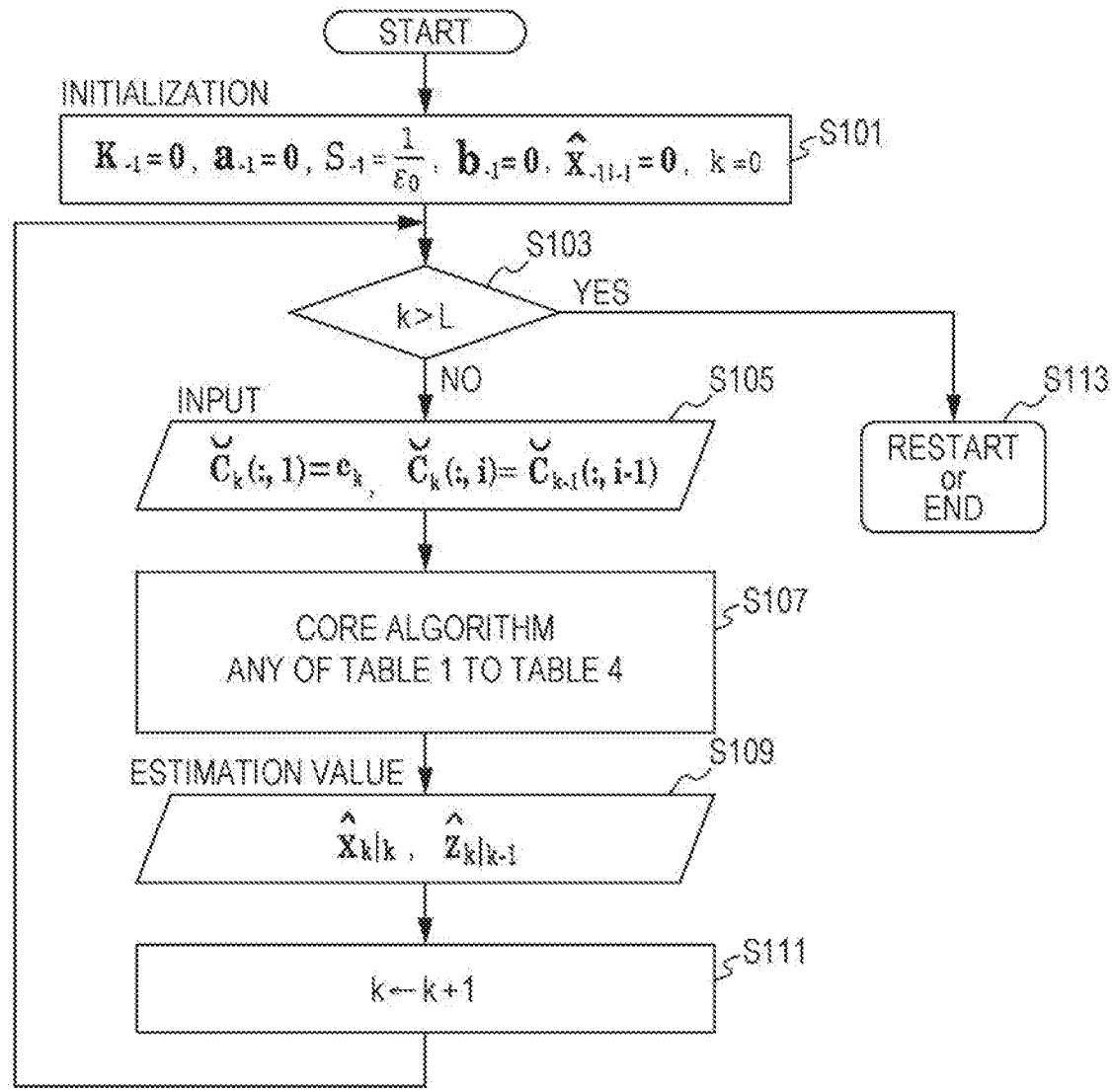
FIG. 2: FLOWCHART OF FAST $H_\infty$ FILTER GROUP; INITIALIZATION OF $a_k$ AND $b_k$ IS NOT NECESSARY IN TABLE 3 (C-WFHF) AND TABLE 4 (C-NLMS)

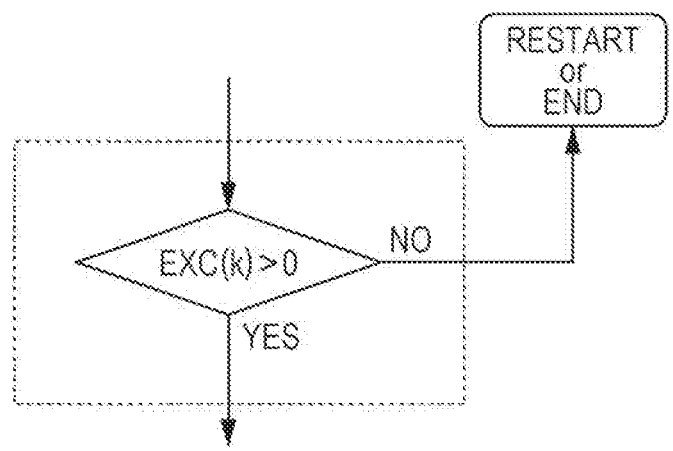
FIG. 3: CHECKING OF EXISTENCE CONDITION; $EXC(k) = -\rho\hat{\Xi}_k + \rho\gamma_f^2$

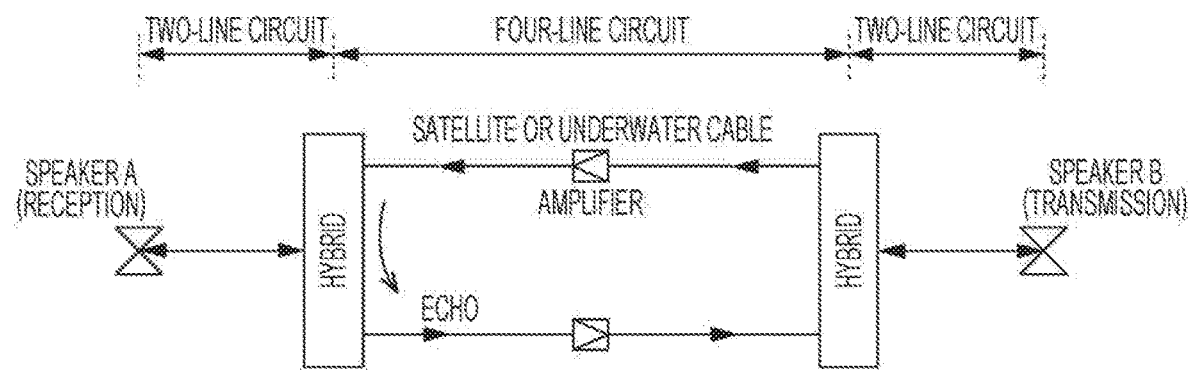
FIG. 4: COMMUNICATION SYSTEM AND ECHO
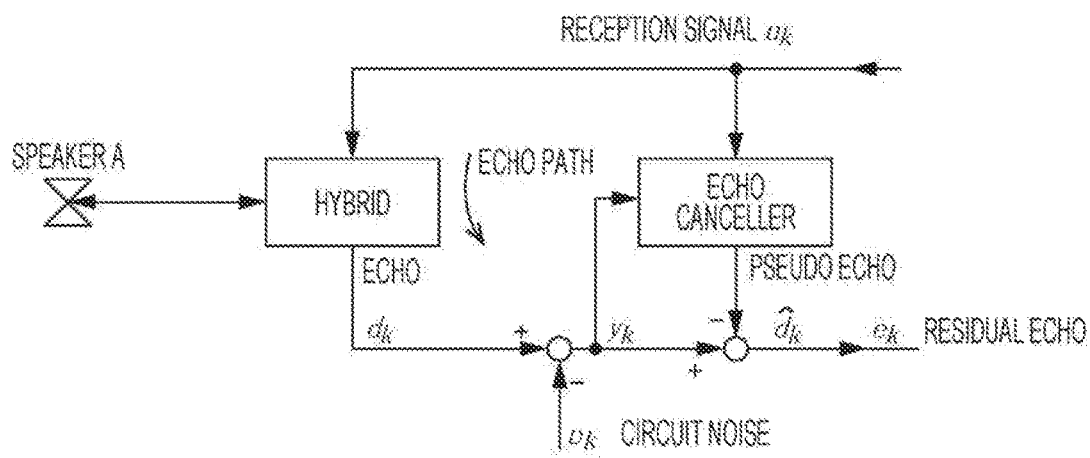
FIG. 5: PRINCIPLE OF ECHO CANCELLER FIG. 6: TRANSITION OF TAP SQUARE ERROR IN PROPOSED METHOD (C-FHF) AND OTHER METHODS (AR(2) SIGNAL); $\gamma_f = 1.4$, $\rho = 0.996$, $\epsilon_0 = 10.0$

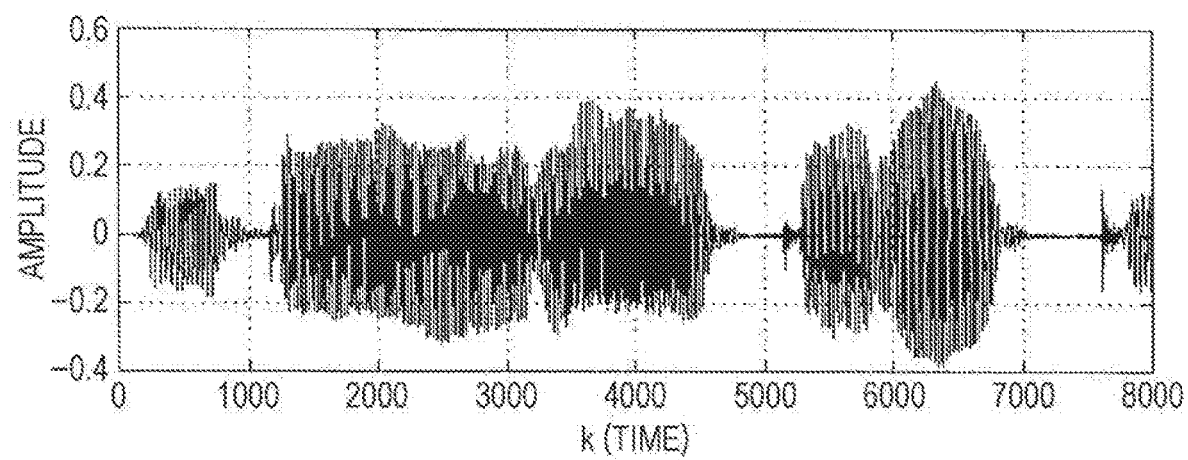
FIG. 7: AUDIO SIGNAL

FIG. 8: TRANSITION OF TAP SQUARE ERROR IN PROPOSED METHOD (C-FHF) AND OTHER METHODS (AUDIO SIGNAL), $\gamma_f = 1.4$, $\rho = 0.996$, $\epsilon_0 = 10.0$

FIG. 9

| EQUATIONS | Mul. | Add. |
|---|---|---|
| $\tilde{e}_k = c_k + C_{k-1} a_{k-1}$ | $N$ | $N$ |
| $a_k = a_{k-1} - K_{k-1} W \tilde{e}_k$ | $N+1$ | $N+1$ |
| $e_k = c_k + C_{k-1} a_k$ | $N$ | $N$ |
| $S_k = \rho S_{k-1} + e_k^T W \tilde{e}_k$ | 3 | 2 |
| $\begin{bmatrix} m_k \\ \mu_k \end{bmatrix} = \begin{bmatrix} 0 \\ K_{k-1} \end{bmatrix} + \begin{bmatrix} 1 \\ a_k \end{bmatrix} \frac{e_k^T}{S_k}$ | $N$ | $N$ |
| $\underline{\tilde{e}}_k = c_{k-N} + C_k b_{k-1}$ | $N$ | $N$ |
| $b_k = [b_{k-1} - m_k W \underline{\tilde{e}}_k][1 - \mu_k W \underline{\tilde{e}}_k]^{-1}$ | $2N+3$ | $N+3$ |
| $K_k = m_k - b_k \mu_k$ | $N$ | $N$ |
| $\hat{x}_{k|k} = \hat{x}_{k-1|k-1} + K_k(:,1) \frac{y_k - H_k x_{k-1|k-1}}{1+\gamma_f^{-2} H_k K_k(:,1)}$ | $3N+1$ | $3N$ |
| TOTAL NUMBER | $11N+8$ | $10N+6$ |

FIG. 10

| EQUATIONS | Mul. | Add. |
|---|---|---|
| $\tilde{e}_k = c_k + C_{k-1} a_{k-1}$ | $N$ | $N$ |
| $e_k = \chi_{k-1}^{-1} \tilde{e}_k$ | 2 | 2 |
| $S_k = \rho S_{k-1} + e_k^T W \tilde{e}_k$ | 3 | 2 |
| $a_k = a_{k-1} - \rho^{-1} \tilde{K}_{k-1} W e_k$ | $N+2$ | $N+1$ |
| $\begin{bmatrix} \hat{m}_k \\ \tilde{\mu}_k \end{bmatrix} = \begin{bmatrix} 0 \\ \check{K}_{k-1} \end{bmatrix} + \begin{bmatrix} 1 \\ a_{k-1} \end{bmatrix} \frac{\tilde{e}_k^T}{S_{k-1}}$ | $N+1$ | $N$ |
| $\tilde{K}_k = \hat{m}_k - b_{k-1} \tilde{\mu}_k$ | $N$ | $N$ |
| $\underline{\tilde{e}}_k = \underline{S}_{k-1} \tilde{\mu}_k^T$ | 1 | 0 |
| $R_{e,k} = R_{e,k-1} + \frac{\tilde{e}_k \tilde{e}_k^T}{S_{k-1}} - \tilde{e}_k \tilde{\mu}_k$ | 3 | 6 |
| $\chi_k^{-1} = \rho W^{-1} R_{e,k}^{-1}$ | 10 | 1 |
| $\underline{e}_k = \chi_k^{-1} \underline{\tilde{e}}_k$ | 2 | 2 |
| $\underline{S}_k = \rho \underline{S}_{k-1} + \underline{e}_k^T W \underline{\tilde{e}}_k$ | 3 | 2 |
| $b_k = b_{k-1} - \rho^{-1} \tilde{K}_k W \underline{e}_k$ | $N+2$ | $N+1$ |
| $\hat{x}_{k\|k} = \hat{x}_{k-1\|k-1} + \tilde{K}_k(:,1) \frac{y_k - H_k \hat{x}_{k-1\|k-1}}{R_{e,k}(1,1)}$ | $2N$ | $2N$ |
| TOTAL NUMBER | $7N+29$ | $7N+17$ |

FIG. 11

| EQUATIONS | Mul. | Add. |
|---|---|---|
| $S_k = \rho S_{k-1} + \tilde{c}_k^T W \tilde{c}_k$ | 3 | 2 |
| $\begin{bmatrix} \hat{K}_k \\ \tilde{\mu}_k \end{bmatrix} = \begin{bmatrix} c_k^T / S_{k-1} \\ \hat{K}_{k-1} \end{bmatrix}$ | 1 | 0 |
| $R_{e,k} = R_{e,k-1} + \frac{c_k c_k^T}{S_{k-1}} - c_{k-N} \tilde{\mu}_k$ | 3 | 6 |
| $\hat{x}_{k|k} = \hat{x}_{k-1|k-1} + \mu \tilde{K}_k(:,1) \frac{y_k - H_k \hat{x}_{k-1|k-1}}{R_{e,k}(1,1)}$ | $2N+1$ | $2N$ |
| TOTAL NUMBER | $2N+8$ | $2N+8$ |

FIG. 12

| EQUATIONS | Mul. | Add. |
|---|---|---|
| $\begin{bmatrix} \tilde{K}_k \\ \tilde{\mu}_k \end{bmatrix} = \begin{bmatrix} \epsilon_0 c_k^T \\ \hat{K}_{k-1} \end{bmatrix}$ | 1 | 0 |
| $R_{e,k} = R_{e,k-1} + \epsilon_0 c_k c_k^T - c_{k-N} \tilde{\mu}_k$ | 3 | 6 |
| $\hat{x}_{k|k} = \hat{x}_{k-1|k-1} + \mu \tilde{K}_k(:,1) \frac{y_k - H_k \hat{x}_{k-1|k-1}}{R_{e,k}(1,1)}$ | $2N+1$ | $2N$ |
| TOTAL NUMBER | $2N+5$ | $2N+6$ |

FIG. 13

| $h_0$ | $h_1$ | $h_2$ | $h_3$ | $h_4$ | $h_5$ | $h_6$ | $h_7$ |
|---|---|---|---|---|---|---|---|
| 0.0 | 0.008 | -0.012 | 0.064 | 0.013 | -0.052 | -0.007 | 0.039 |
| $h_8$ | $h_9$ | $h_{10}$ | $h_{11}$ | $h_{12}$ | $h_{13}$ | $h_{14}$ | $h_{15}$ |
| 0.011 | 0.0 | -0.002 | -0.009 | -0.016 | -0.013 | -0.001 | 0.004 |
| $h_{16}$ | $h_{17}$ | $h_{18}$ | $h_{19}$ | $h_{20}$ | $h_{21}$ | $h_{22}$ | $h_{23}$ |
| 0.015 | 0.013 | 0.007 | 0.0 | -0.001 | -0.002 | -0.001 | 0.0 |

FIG. 15

| EQUATIONS | Mul. | Div. | Add |
|---|---|---|---|
| $S_k = \rho S_{k-1} + (1 - \gamma_f^{-2})u_k^2$ | 3 | 0 | 2 |
| $\tilde{K}_k(:,1) = \begin{bmatrix} u_k/S_{k-1} \\ \tilde{K}_{k-1}(1:N-1,1) \end{bmatrix}$ | 0 | 1 | 0 |
| $R_{e,k}(1,1) = R_{e,k-1}(1,1) + \dfrac{u_k^2}{S_{k-1}} - u_{k-N}\tilde{K}_{k-1}(N,1)$ | 2 | 0 | 2 |
| $\hat{x}_k = \hat{x}_{k-1} + \mu \tilde{K}_k(:,1)\dfrac{y_k - H_k\hat{x}_{k-1}}{R_{e,k}(1,1)}$ | 2N+1 | 1 | 2N |
| TOTAL NUMBER | 2N+6 | 2 | 2N+4 |

FIG. 16

| EQUATIONS | Mul. | Div. | Add |
|---|---|---|---|
| $\tilde{K}_k(:,1) = \begin{bmatrix} \epsilon_0 u_k \\ \tilde{K}_{k-1}(1:N-1,1) \end{bmatrix}$ | 1 | 0 | 0 |
| $R_{e,k}(1,1) = R_{e,k-1}(1,1) + \epsilon_0 u_k^2 - u_{k-N}\tilde{K}_{k-1}(N,1)$ | 2 | 0 | 2 |
| $\hat{x}_k = \hat{x}_{k-1} + \mu \tilde{K}_k(:,1)\dfrac{y_k - H_k\hat{x}_{k-1}}{R_{e,k}(1,1)}$ | 2N+1 | 1 | 2N |
| TOTAL NUMBER | 2N+4 | 1 | 2N+2 |

SYSTEM IDENTIFICATION DEVICE, SYSTEM IDENTIFICATION METHOD, SYSTEM IDENTIFICATION PROGRAM, AND RECORDING MEDIUM RECORDING SYSTEM IDENTIFICATION PROGRAM

CROSS-REFERENCE TO RELATED APPLICATION

This application claims priority from Japanese Patent Application No. 2018-098503 filed with the Japan Patent Office on May 23, 2018, the entire content of which is hereby incorporated by reference.

BACKGROUND

1. Technical Field

An embodiment of the present disclosure relates to a system identification device, a system identification method, a system identification program, and a recording medium recording the system identification program. Specifically, the embodiment of the present disclosure relates to a system identification device, a system identification method, a system identification program, and a recording medium recording the system identification program for numerically and stably identifying a large-sized acoustic or communication system at high speed.

2. Related Art

System identification indicates that a mathematical model (e.g., a transfer function and an impulse response) of an input/output relationship of a system is estimated based on input/output data. Representative application examples include an echo canceller in international communication, an automatic equalizer in data communication, an echo canceller, sound field reproduction and active noise control in an acoustic system, and a feedback canceller used for a hearing aid. Typically, a least mean square (LMS) algorithm, a recursive least square (RLS) algorithm, and a Kalman filter have been widely used as adaptive algorithms in system identification. Generally, an input/output relationship of a linear system is represented as follows.

$$y_k = \sum_{i=0}^{N-1} h_i u_{k-i} + v_k \tag{1}$$

In this case, $u_k$ is input, $h_i$ is an impulse response of the system, and $y_k$ is output including noise $v_k$ upon observation.

Details are described in Non-Patent Document 1 and others.

1. LMS Algorithm

LMS estimates the impulse response $x_k = [h_0, \ldots, h_{N-1}]^T$ of the system as follows from the input $u_k$ and the output $y_k$.

$$\hat{\chi}_k = \hat{\chi}_{k-1} + \mu H_k^T(y_k - H_k\hat{\chi}_{k-1}) \tag{2}$$

Note that $H_k = [u_k, \ldots, u_{k-N+1}]^T$ is satisfied, and $\mu(\mu>0)$ is called a step size. Moreover, an algorithm whose step size $\mu$ is replaced with $\mu/(\|H^T_k\|^2+\delta)$ is called an NLMS algorithm. In this case, $\delta$ is a positive constant set in advance such that the denominator is not zero even in absence of input.

2. RLS

RLS estimates the impulse response $x_k = [h_0, \ldots, h_{N-1}]^T$ of the system as follows from the input $u_k$ and the output $y_k$.

$$\hat{x}_k = \hat{x}_{k-1} + K_k(y_k - H_k\hat{x}_{k-1}) \tag{3}$$

$$K_k = \frac{P_{k-1}H_k^T}{\rho + H_k P_{k-1} H_k^T} \tag{4}$$

$$P_k = (P_{k-1} - K_k H_k P_{k-1})/\rho \tag{5}$$

Note that a relationship expression of $\hat{\chi}_o = 0$, $P_o = \epsilon_o I$, $\epsilon_o > 0$ is satisfied. 0 is a zero vector. I is a unit matrix. Moreover, a forgetting factor $\rho$ satisfies $0 < \rho \le 1$. (Note that "^" and "~" mean estimation values, and as indicated by a mathematical expression, is assigned to just above characters in a normal situation. Note that for convenience of input, these signs are sometimes described on an upper right side of characters. The same applies hereinafter.)

3. Kalman Filter

Linear System Represented by State Space Model $$\chi_{k+1} = \rho^{-1/2}\chi_k, \quad y_k = H_k \chi_k + v_k \tag{6}$$

Regarding this expression, the minimum variance estimation value $\hat{x}_{k|k}$ of a state $x_k$ is obtained by the following Kalman filter.

$$\hat{\chi}_{k|k} = \hat{\chi}_{k|k-1} + K_k(y_k - H_k\hat{\chi}_{k|k-1})$$

$$\hat{\chi}_{k+1|k} = \rho^{-1/2}\hat{\chi}_{k|k} \tag{7}$$

$$K_k = \hat{\Sigma}_{k|k-1}H_k^T(\rho + H_k\hat{\Sigma}_{k|k-1}H_k^T)^{-1} \tag{8}$$

$$\hat{\Sigma}_{k|k} = \hat{\Sigma}_{k|k-1} - K_k H_k \hat{\Sigma}_{k|k-1}$$

$$\hat{\Sigma}_{k+1|k} = \hat{\Sigma}_{k|k}/\rho \tag{9}$$

$x_k$: a state vector or merely the state; unknown, and this is a target for estimation.

Note that Relationship Expression (10) below is satisfied.

$$\hat{\chi}_{0|-1} = 0, \hat{\Sigma}_{0|-1} = \epsilon_0 I, \epsilon_0 > 0 \tag{10}$$

$y_k$: an observation signal; taken as filter input, and known.
$H_k$: an observation matrix; known.
$v_k$: observation noise; unknown.
$\rho$: a forgetting factor; generally determined by trial and error.
$K_k$: a filter gain; obtained from a matrix $\hat{\Sigma}_{k|k-1}$.
$\hat{\Sigma}_{k|k}$: corresponding to a covariance matrix of an error of $\hat{x}_{k|k}$; obtained by a Riccati equation.
$\hat{\Sigma}_{k+1|k}$: corresponding to a covariance matrix of an error of $\hat{x}_{k+1|k}$; obtained by the Riccati equation.
$\hat{\Sigma}_{0|-1}$: corresponding to a covariance matrix of an initial state; unknown in a normal situation, but $\epsilon_0 I$ is used for convenience.

There are other typical techniques described in Patent Documents 1 to 3 and Non-Patent Documents 2 to 6 below.
Patent Document 1: Japanese Patent No. 4067269
Patent Document 2: Japanese Patent No. 4444919
Patent Document 3: Japanese Patent No, 5196653
Non-Patent Document 1: S. Haykin, Adaptive Filter Theory, 3rd Edition, Prentice-Hall, 1996
Non-Patent Document 2: K. Nishiyama, Derivation of a Fast Algorithm of Modified $H_\infty$ Filters, Proceedings of IEEE International Conference on Industrial Electronics, Control and instrumentation, RBC-II, pp. 462-467, 2000
Non-Patent Document 3: K. Nishiyama, An $H_\infty$ Optimization and Its Fast Algorithm for Time-Variant System Identification, IEEE Transactions on Signal Processing, 52, 5, pp. 1335-1342, 2004

Non-Patent Document 4: K. Nishiyama, A Unified View of Adaptive Algorithms for Finite Impulse Response Filters using the $H_\infty$ Framework, Signal Processing (Elsevier), 97, pp. 55-64, April 2014

Non-Patent Document 5: B. Hassib A. H. Sayed, and T. Kailath, Indefinite-Quadratic Estimation and Control, 1st Edition, SIAM, 1999

Non-Patent Document 6: G. Glentis, K. Berberidis, and S. Theodoridis, Efficient least squares adaptive algorithms for FIR, transversal filtering, IEEE Signal Processing Magazine, 16, 4, pp. 13-41, 1999

SUMMARY

Provided is a system identification method for performing fast real-time identification for a system from input/output data, in which a filter robust to disturbance is used in such a manner that a maximum energy gain from the disturbance to a filter error is, as an evaluation criterion, set smaller than a given upper limit $\gamma_f^2$, and the filter is, by Expressions (49) to (62) below, provided to a state space model represented by Expressions (11) to (13) below to estimate a state estimation value $\hat{x}_{k|k}$ of a state $x_k$ of the system:

$$x_{k+1} = x_k + G_k w_k, \quad w_k, x_k \in \mathcal{R}^N \tag{11}$$

$$y_k = H_k x_k + v_k, \quad y_k, v_k \in \mathcal{R} \tag{12}$$

$$z_k = H_k x_k, \quad z_k \in \mathcal{R}, \quad H_k \in \mathcal{R}^{1 \times N} \tag{13}$$

$$\hat{x}_{k|k} = \hat{x}_{k-1|k-1} + K_{s,k}(y_k - H_k \hat{x}_{k-1|k-1}) \tag{49}$$

$$K_{s,k} = \frac{\overline{K}_k(:,1)}{R_{e,k}(1,1)} \tag{50}$$

$$b_k = b_{k-1} - \rho^{-1} \overline{K}_k W \underline{e}_k \tag{51}$$

$$\underline{S}_k = \rho \underline{S}_{k-1} + \underline{e}_k^T W \underline{\tilde{e}}_k \tag{52}$$

$$\underline{e}_k = X_k^{-1} \underline{\tilde{e}}_k \tag{53}$$

$$X_k = \rho^{-1} R_{e,k} W \tag{54}$$

$$R_{e,k} = R_{e,k-1} + \frac{\tilde{e}_k \tilde{e}_k^T}{S_{k-1}} - \tilde{e}_k \tilde{\mu}_k \tag{55}$$

$$\tilde{e}_k = S_{k-1} \tilde{\mu}_k^T \tag{56}$$

$$\tilde{K}_k = \tilde{m}_k - b_{k-1} \tilde{\mu}_k \tag{57}$$

$$\begin{bmatrix} \tilde{m}_k \\ \tilde{\mu}_k \end{bmatrix} = \begin{bmatrix} 0 \\ \tilde{K}_{k-1} \end{bmatrix} + \begin{bmatrix} 1 \\ a_{k-1} \end{bmatrix} \frac{\tilde{e}_k^T}{\underline{S}_{k-1}} \tag{58}$$

$$a_k = a_{k-1} - \rho^{-1} \tilde{K}_{k-1} W e_k \tag{59}$$

$$S_k = \rho S_{k-1} + e_k^T W \tilde{e}_k \tag{60}$$

$$e_k = X_{k-1}^{-1} \tilde{e}_k \tag{61}$$

$$\tilde{e}_k = c_k + \check{C}_{k-1} a_{k-1} \tag{62}$$

where $\check{C}_k$ and $W$ are defined by the following expressions:

$$\check{C}_k = \begin{bmatrix} H_k \\ H_k \end{bmatrix}, \quad W = \begin{bmatrix} 1 & 0 \\ 0 & -\gamma_f^{-2} \end{bmatrix},$$

$\underline{e}_k \in \mathcal{R}^{2 \times 1}$ is a first column vector of $\check{C}_k = [c_k, \ldots, c_{k-N+1}]$, $$\check{C}_k = \begin{bmatrix} u_k & \cdots & u_{k-N} \\ u_k & \cdots & u_{k-N} \end{bmatrix} \tag{63}$$

$$\check{C}_k(:,1) = c_k = [u_k \ u_k]^T, \quad \check{C}_k(:,i) = \check{C}_{k-1}(:,i-1), \tag{64}$$
$i = 2, \ldots, N+1$
$H_k = [u_k, \ldots, u_{k-N+1}]^T,$ $x_k$: a state vector or merely a state; unknown, and this is a target for estimation,
$x_0$: an initial state; unknown,
$w_k$: system noise; unknown,
$v_k$: observation noise; unknown,
$y_k$: an observation signal; taken as filter input, and known,
$z_k$: an output signal; unknown,
$G_k$: a drive matrix; known upon execution,
$H_k$: an observation matrix, known,
$\hat{x}_{k|k}$: an estimation value, using observation signals $y_0$ to $y_k$, of the state $x_k$ (an impulse response of an unknown system) at time k; provided by a filter equation,
$\hat{x}_{k+1|k}$: a single-step prediction value, using the observation signals $y_0$ to $y_k$, of a state $x_{k+1}$ at the time k; provided by the filter equation;
$\hat{x}_{-1|-1}$: an initial estimation value of the state; unknown in a normal situation, but zero is used for convenience,
$K_{s,k}$: a filter gain; obtained from a matrix $\Sigma_{k|k-1}$,
$R_{e,k}$: an auxiliary variable; a 2×2 matrix,
$\chi_k$: a conversion factor; a 2×2 matrix,
N: a dimension (a tap number) of the state vector; provided in advance,
$\mu_k$: an N+1-th 1×2 row vector of $K^U_k$; obtained by $K^U_k$,
$m_k$: an N×2 matrix including first to N-th rows of $K^U_k$; obtained by $K^U_k$,
W: a weighting matrix; determined by $\gamma_f$,
$a_k$: a forward linear prediction factor; an N-dimensional column vector,
$b_k$: a backward linear prediction factor; an N-dimensional column vector,
$e_k$: an ex-post forward prediction error; a two-dimensional column vector,
$\underline{e}_k$: an ex-post backward prediction error; a two-dimensional column vector, and
$\gamma_f$: an attenuation level; provided upon designing.

BRIEF DESCRIPTION OF THE DRAWINGS

FIG. 1 is a graph for describing distribution and properties of a solution in a $\gamma_f$-$\sigma_w^2$ space;

FIG. 2 is a flowchart of the processing of obtaining $\hat{x}_{k|k}$, $\hat{z}_{k|k-1} = H_k \hat{x}_{k-1|k-1}$ by a fast $H_\infty$ filter group;

FIG. 3 is a flowchart regarding checking of a scalar existence condition;

FIG. 4 is a diagram for describing a communication system and echo;

FIG. 5 is a principle diagram of an echo canceller;

FIG. 7 is a graph for describing an audio signal;

FIG. 9 is a table (Table 1) for describing the processing and time complexity of a fast $H_\infty$ filter;

FIG. 10 is a table (Table 2) for describing the processing and time complexity of a C-fast $H_\infty$ filter;

FIG. 11 is a table (Table 3) for describing the processing and time complexity of a C-whiten fast $H_\infty$ filter;

FIG. 12 is a table (Table 4) for describing the processing and time complexity of a filter of a C-NLMS algorithm;

FIG. 13 is a table (Table 5) showing an impulse response of an echo path;

FIG. 15 is a table for describing the processing and time complexity of one example of an optimal version of the C-whiten fast $H_\infty$ filter; and FIG. 16 is a table for describing the processing and time complexity of one example of an optimal version of the filter of the C-NLMS algorithm,

DETAILED DESCRIPTION

Figure 6A:
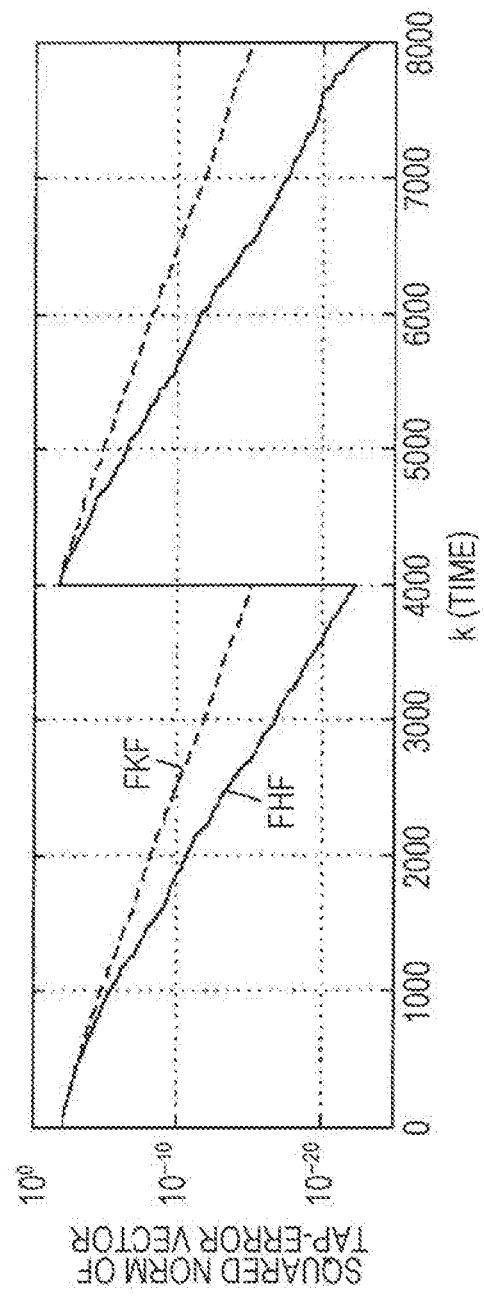
FIGS. 6A and 6B are graphs for describing transition of a tap square error in the present embodiment (C-FHF) and other methods.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Currently, an adaptive algorithm most widely used for system identification is LMS. LMS has such a problem that a computational complexity is small, but a convergence speed is extremely slow. Meanwhile, $\hat{\Sigma}_{k|k-1}$ and $P_k$ of RLS and a Kalman filter are positive-definite symmetric matrixes in a normal situation. However, in single-precision (e.g., 32 bit) calculation, this condition is not satisfied infrequently. This is one factor for numerically bringing the Kalman filter and RLS into an unstable state. Moreover, the computational complexity is $O(N^2)$. Thus, in a case where the dimension (the tap number) N of a state vector $x_k$ is great, the number of times of data processing per step is significantly increased. Thus, in some cases, these algorithms are not considered suitable for real-time processing.

One object of the present disclosure is to identify a large-sized acoustic or communication system with high accuracy at high speed. Moreover, another object of the present disclosure is to apply, e.g., a system identification method and a system identification device for implementing such identification to a feedback canceller.

A system identification device according to a first embodiment of the present disclosure is a system identification device for performing fast real-time identification for a system from input/output data. The device includes a filter robust to disturbance, by setting a maximum energy gain from the disturbance to a filter error, as an evaluation criterion, smaller than a given upper limit $\gamma_f^2$, in which the filter is, by Expressions (49) to (62) below, provided to a state space model represented by Expressions (11) to (13) below to estimate a state estimation value $\hat{x}_{k|k}$ of a state $x_k$ of the system:

$$x_{k+1} = x_k + G_k w_k, \quad w_k, x_k \in \mathcal{R}^N \quad (11)$$

$$y_k = H_k x_k + v_k, \quad y_k, v_k \in \mathcal{R} \quad (12)$$

$$z_k = H_k x_k, \quad z_k \in \mathcal{R}, \quad H_k \in \mathcal{R}^{1 \times N} \quad (13)$$

$$\hat{x}_{k|k} = \hat{x}_{k-1|k-1} + K_{s,k}(y_k - H_k \hat{x}_{k-1|k-1}) \quad (49)$$

-continued $$K_{s,k} = \frac{\bar{K}_k(:,1)}{R_{e,k}(1,1)} \quad (50)$$

$$b_k = b_{k-1} - \rho^{-1} \bar{K}_k W e_k \quad (51)$$

$$S_k = \rho S_{k-1} + e_k^T W \tilde{e}_k \quad (52)$$

$$e_k = X_k^{-1} \tilde{e}_k \quad (53)$$

$$X_k = \rho^{-1} R_{e,k} W \quad (54)$$

$$R_{e,k} = R_{e,k-1} + \frac{\tilde{e}_k \tilde{e}_k^T}{S_{k-1}} - \tilde{e}_k \tilde{\mu}_k \quad (55)$$

$$\tilde{e}_k = S_{k-1} \tilde{\mu}_k^T \quad (56)$$

$$\tilde{K}_k = \tilde{m}_k - b_{k-1} \tilde{\mu}_k \quad (57)$$

$$\begin{bmatrix} \tilde{m}_k \\ \tilde{\mu}_k \end{bmatrix} = \begin{bmatrix} 0 \\ \tilde{K}_{k-1} \end{bmatrix} + \begin{bmatrix} 1 \\ a_{k-1} \end{bmatrix} \frac{\tilde{e}_k^T}{S_{k-1}} \quad (58)$$

$$a_k = a_{k-1} - \rho^{-1} \tilde{K}_{k-1} W e_k \quad (59)$$

$$S_k = \rho S_{k-1} + e_k^T W \tilde{e}_k \quad (60)$$

$$e_k = X_{k-1}^{-1} \tilde{e}_k \quad (61)$$

$$\tilde{e}_k = c_k + C_{k-1} a_{k-1} \quad (62)$$

where $C_k$ and W are defined by the following expressions:

$$C_k = \begin{bmatrix} H_k \\ H_k \end{bmatrix}, \quad W = \begin{bmatrix} 1 & 0 \\ 0 & -\gamma_f^{-2} \end{bmatrix},$$

$e_k \in \mathcal{R}^{2 \times 1}$ is a first column vector of $C_k = [c_k, \ldots, c_{k-N+1}]$, $$\check{C}_k = \begin{bmatrix} u_k & \cdots & u_{k-N} \\ u_k & \cdots & u_{k-N} \end{bmatrix} \quad (63)$$

$$\check{C}_k(:,1) = c_k = [u_k \; u_k]^T, \; \check{C}_k(:,i) = \check{C}_{k-1}(:,i-1), \quad (64)$$
$i = 2, \ldots, N+1$
$H_k = [u_k, \ldots, u_{k-N+1}]^T,$ $x_k$: a state vector or merely a state; unknown, and this is a target for estimation, $x_0$: an initial state; unknown, $w_k$: system noise; unknown, $v_k$: observation noise; unknown, $y_k$: an observation signal; taken as filter input, and known, $z_k$: an output signal; unknown, $G_k$: a drive matrix; known upon execution, $H_k$ an observation matrix, known, $\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation;

$\hat{x}_{-1|-1}$: an initial estimation value of the state; unknown in a normal situation, but zero is used for convenience, $K_{s,k}$: a filter gain; obtained from a matrix $\hat{\Sigma}_{k|k-1}$, $R_{e,k}$: an auxiliary variable; a 2×2 matrix, $\chi_k$: a conversion factor; a 2×2 matrix, N: a dimension (a tap number) of the state vector; provided in advance, $\tilde{\mu}_k$: an N+1-th 1×2 row vector of $K^U_k$; obtained by $K^U_k$, $m_k$: an N×2 matrix including first to N-th rows of $K^U_k$; obtained by $K^U_k$, W: a weighting matrix; determined by $\gamma_f$, $a_k$: a forward linear prediction factor; an N-dimensional column vector, $b_k$: a backward linear prediction factor; an N-dimensional column vector, $e_k$: an ex-post forward prediction error; a two-dimensional column vector, $\underline{e}_k$: an ex-post backward prediction error; a two-dimensional column vector, and $\gamma_f$: an attenuation level; provided upon designing.

A system identification device according to a second embodiment of the present disclosure is a system identification device for performing fast real-time identification for a system from input/output data. The device includes a filter robust to disturbance, by setting a maximum energy gain from the disturbance to a filter error, as an evaluation criterion, smaller than a given upper limit $\gamma_f^2$, in which the filter is, by Expressions (49), (50), (55), (58), (60) to (62) below, provided to a state space model represented by Expressions (11) to (13) below to estimate a state estimation value $\hat{x}_{k|k}$ of a state $x_k$ of the system:

$$x_{k+1} = x_k + G_k w_k, w_k, x_k \in \mathcal{R}^N \quad (11)$$

$$y_k = H_k x_k + v_k, y_k, v_k \in \mathcal{R} \quad (12)$$

$$z_k = H_k x_k, z_k \in \mathcal{R}, H_k \in \mathcal{R}^{1 \times N} \quad (13)$$

$$\hat{x}_{k|k} = \hat{x}_{k-1|k-1} + \mu \frac{\tilde{K}_k(:,1)}{R_{e,k}(1,1)} (y_k - H_k \hat{x}_{k-1|k-1}) \quad (49), (50)$$

$$R_{e,k} = R_{e,k-1} + \frac{c_k c_k^T}{S_{k-1}} - c_{k-N} \tilde{\mu}_k \quad (55)$$

$$\begin{bmatrix} \tilde{K}_k \\ \tilde{\mu}_k \end{bmatrix} = \begin{bmatrix} c_k / S_{k-1} \\ \tilde{K}_{k-1} \end{bmatrix} \quad (58)$$

$$S_k = \rho S_{k-1} + c_k^T W \check{c}_k = \rho S_{k-1} + 1(\gamma_f^{-2}) u_k^2 \quad (60)$$

$$\tilde{e}_k = c_k, e_k = c_k, c_k = [u_k \ u_k]^T \quad (61), (62)$$

where $C_k$ and W are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

$c_k \in \mathcal{R}^{2 \times 1}$ is a first column vector of $C_k = [c_k, \ldots, c_{k-N+1}]$, $$\check{C}_k = \begin{bmatrix} u_k & \cdots & u_{k-N} \\ u_k & \cdots & u_{k-N} \end{bmatrix} \quad (63)$$

$$\check{C}_k(:,1) = c_k = [u_k \ u_k]^T, \check{C}_k(:,i) = \check{C}_{k-1}(:,i-1), \quad (64)$$
$i = 2, \ldots, N+1$
$H_k = [u_k, \ldots, u_{k-N+1}]^T,$ $x_k$: a state vector or merely a state; unknown, and this is a target for estimation, $x_0$: an initial state; unknown, $w_k$: system noise; unknown, $v_k$: observation noise; unknown, $y_k$: an observation signal; taken as filter input, and known, $z_k$: an output signal; unknown, $G_k$: a drive matrix; known upon execution, $H_k$: an observation matrix, known, $\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $K_{s,k}$: a filter gain; obtained from a matrix $\Sigma_{k|k-1}$, $R_{c,k}$: an auxiliary variable; a 2×2 matrix, N: a dimension (a tap number) of the state vector; provided in advance, $\tilde{\mu}_k$: an N+1-th 1×2 row vector of $K^U_k$; obtained by $K^U_k$, W: a weighting matrix; determined by $\gamma_f$, $e_k$: an ex-post forward prediction error; a two-dimensional column vector, $\underline{e}_k$: an ex-post backward prediction error; a two-dimensional column vector, $\gamma_f$: an attenuation level; provided upon designing, and $\mu$: a step size (a relaxation factor); a real number of $\mu > 0$, and provided in advance.

A system identification device according to third embodiment of the present disclosure is a system for performing fast real-time identification for a system from input/output data. The device includes a filter robust to disturbance, by setting a maximum energy gain from the disturbance to a filter error, as an evaluation criterion, smaller than a given upper limit $\gamma_f^2$, in which the filter is, by Expressions (49), (50), (55), (58) below, provided to a state space model represented by Expressions (11) to (13) below to estimate a state estimation value $\hat{x}_{k|k}$ of a state $x_k$ of the system:

$$x_{k+1} = x_k + G_k w_k, w_k, x_k \in \mathcal{R}^N \quad (11)$$

$$y_k = H_k x_k + v_k, y_k, v_k \in \mathcal{R} \quad (12)$$

$$z_k = H_k x_k, z_k \in \mathcal{R}, H_k \in \mathcal{R}^{1 \times N} \quad (13)$$

$$\hat{x}_{k|k} = \hat{x}_{k-1|k-1} + \mu \frac{\tilde{K}_k(:,1)}{R_{e,k}(1,1)} (y_k - H_k \hat{x}_{k-1|k-1}) \quad (49), (50)$$

$$R_{e,k} = R_{e,k-1} + \epsilon_0 c_k c_k^T - c_{k-N} \tilde{\mu}_k \quad (55)$$

$$\begin{bmatrix} \tilde{K}_k \\ \tilde{\mu}_k \end{bmatrix} = \begin{bmatrix} \epsilon_0 c_k \\ \tilde{K}_{k-1} \end{bmatrix} \quad (58)$$

where $C_k$ and W are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

$c_k \in \mathcal{R}^{2 \times 1}$ is a first column vector of $C_k = [c_k, \ldots, c_{k-N+1}]$, $$\check{C}_k = \begin{bmatrix} u_k & \cdots & u_{k-N} \\ u_k & \cdots & u_{k-N} \end{bmatrix} \quad (63)$$

-continued $$\check{C}_k(:,1) = c_k = [u_k \quad u_k]^T, \check{C}_k(:,i) = \check{C}_{k-1}(:,i-1), \quad (64)$$
$$i = 2, \ldots, N+1$$

$H_k = [u_k, \ldots, u_{k-N+1}]^T$, $x_k$: a state vector or merely a state; unknown, and this is a target for estimation, $x_0$: an initial state; unknown, $w_k$: system noise; unknown, $v_k$: observation noise; unknown, $y_k$: an observation signal; taken as filter input, and known, $G_k$: an output signal; unknown, $G_k$: a drive matrix; known upon execution, $H_k$: an observation matrix, known, $\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $k_{s,k}$: a filter gain; obtained from a matrix $\hat{\Sigma}_{k|k-1}$, $R_{e,k}$: an auxiliary variable; a 2×2 matrix, N: a dimension (a tap number) of the state vector; provided in advance, $\tilde{\mu}_k$: an N+1-th 1×2 row vector of $K^U_k$; obtained by $K^U_k$, W: a weighting matrix; determined by $\gamma_f$, $e_k$: an ex-post forward prediction error; a two-dimensional column vector, $\underline{e}_k$: an ex-post backward prediction error; a two-dimensional column vector, $\varepsilon_0$: any positive constant; $\varepsilon_0 > 0$, and provided in advance, $\gamma_f$: an attenuation level; provided upon designing, and $\mu$: a step size (a relaxation factor); a real number of $\mu$0, and provided in advance.

A system identification method according to a fourth embodiment of the present disclosure is a system identification method for performing fast real-time identification for a system from input/output data, in which a filter robust to disturbance is used in such a manner that a maximum energy gain from the disturbance to a filter error is, as an evaluation criterion, set smaller than a given upper limit $\gamma_f^2$, and the filter is, by Expressions (49) to (62) below, provided to a state space model represented by Expressions (11) to (13) below to estimate a state estimation value $\hat{x}_{k|k}$ of a state $x_k$ of the system:

$$x_{k+1} = x_k + G_k w_k, w_k, x_k \in \mathcal{R}^N \quad (11)$$

$$y_k = H_k x_k + v_k, y_k, v_k \in \mathcal{R} \quad (12)$$

$$z_k = H_k x_k, z_k \in \mathcal{R}, H_k \in \mathcal{R}^{1 \times N} \quad (13)$$

$$\hat{x}_{k|k} = \hat{x}_{k-1|k-1} + K_{s,k}(y_k - H_k \hat{x}_{k-1|k-1}) \quad (49)$$

$$K_{s,k} = \frac{\tilde{K}_k(:,1)}{R_{e,k}(1,1)} \quad (50)$$

$$b_k = b_{k-1} - \rho^{-1} \tilde{K}_k W \underline{e}_k \quad (51)$$

$$S_k = \rho S_{k-1} + \underline{e}_k^T W \underline{\tilde{e}}_k \quad (52)$$

$$\underline{e}_k = \chi_k^{-1} \underline{\tilde{e}}_k \quad (53)$$

$$\chi_k = \rho^{-1} R_{e,k} W \quad (54)$$

$$R_{e,k} = R_{e,k-1} + \frac{\tilde{e}_k \tilde{e}_k^T}{S_{k-1}} - \tilde{e}_k \tilde{\mu}_k \quad (55)$$

$$\underline{\tilde{e}}_k = \underline{S}_{k-1} \tilde{\mu}_k^T \quad (56)$$

$$\tilde{K}_k = \tilde{m}_k - b_{k-1} \tilde{\mu}_k \quad (57)$$

$$\begin{bmatrix} \tilde{m}_k \\ \tilde{\mu}_k \end{bmatrix} = \begin{bmatrix} 0 \\ \tilde{K}_{k-1} \end{bmatrix} + \begin{bmatrix} 1 \\ a_{k-1} \end{bmatrix} \frac{\tilde{e}_k^T}{S_{k-1}} \quad (58)$$

$$a_k = a_{k-1} - \rho^{-1} \tilde{K}_{k-1} W e_k \quad (59)$$

$$S_k = \rho S_{k-1} + e_k^T W \tilde{e}_k \quad (60)$$

$$e_k = \chi_{k-1}^{-1} \tilde{e}_k \quad (61)$$

$$\tilde{e}_k = c_k + C_{k-1} a_{k-1} \quad (62)$$

where $C_k$ and W are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

$e_k \in \mathcal{R}^{2 \times 1}$ is a first column vector of $C_k = [c_k, \ldots, c_{k-N+1}]$, $$\check{C}_k = \begin{bmatrix} u_k & \cdots & u_{k-N} \\ u_k & \cdots & u_{k-N} \end{bmatrix} \quad (63)$$

$$\check{C}_k(:,1) = c_k = [u_k \quad u_k]^T, \check{C}_k(:,i) = \check{C}_{k-1}(:,i-1), \quad (64)$$
$$i = 2, \ldots, N+1$$
$$H_k = [u_k, \ldots, u_{k-N+1}]^T,$$

$x_k$: a state vector or merely a state; unknown, and this is a target for estimation, $x_0$: an initial state; unknown, $w_k$: system noise; unknown, $v_k$: observation noise; unknown, $y_k$: an observation signal; taken as filter input, and known, $z_k$: an output signal; unknown, $G_k$: a drive matrix; known upon execution, $H_k$: an observation matrix, known, $\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $K_{s,k}$: a filter gain; obtained from a matrix $\hat{\Sigma}_{k|k-1}$, $R_{e,k}$: an auxiliary variable; a 2×2 matrix, $\chi_k$: a conversion factor; a 2×2 matrix, N: a dimension (a tap number) of the state vector; provided in advance, $\tilde{\mu}_k$: an N+1-th 1×2 row vector of $K^U_k$; obtained by $K^U_k$, $m_k$: an N×2 matrix including first to N-th rows of $K^U_k$; obtained by $K^U_k$, W: a weighting matrix; determined by $\gamma_f$, $a_k$: a forward linear prediction factor; an N-dimensional column vector, $b_k$: a backward linear prediction factor; an N-dimensional column vector, $e_k$: an ex-post forward prediction error; a two-dimensional column vector, $\underline{e}_k$: an ex-post backward prediction error; a two-dimensional column vector, and $\gamma_f$: an attenuation level; provided upon designing, A system identification method according to a fifth embodiment of the present disclosure is a system identification method for performing fast real-time identification for a system from input/output data, in which a filter robust to disturbance is used in such a manner that a maximum energy gain from the disturbance to a filter error is, as an evaluation criterion, set smaller than a given upper limit $\gamma_f^2$, and the filter is, by Expressions (49), (50), (55), (58), (60) to (62) below, provided to a state space model represented by Expressions (11) to (13) below to estimate a state estimation value $\hat{x}_{k|k}$ of a state $x_k$ of the system:

$$x_{k+1} = x_k + G_k w_k, w_k, x_k \in \mathcal{R}^N \quad (11)$$

$$y_k = H_k x_k + v_k, y_k, v_k \in \mathcal{R} \quad (12)$$

$$z_k = H_k x_k, z_k \in \mathcal{R}, H_k \in \mathcal{R}^{1 \times N} \quad (13)$$

$$\hat{x}_{k|k} = \hat{x}_{k-1|k-1} + \mu \frac{\tilde{K}_k(:,1)}{R_{e,k}(1,1)} (y_k - H_k \hat{x}_{k-1|k-1}) \quad (49), (50)$$

$$R_{e,k} = R_{e,k-1} + \frac{c_k c_k^T}{S_{k-1}} - c_{k-N} \tilde{\mu}_k \quad (55)$$

$$\begin{bmatrix} \tilde{K}_k \\ \tilde{\mu}_k \end{bmatrix} = \begin{bmatrix} c_k / S_{k-1} \\ \tilde{K}_{k-1} \end{bmatrix} \quad (58)$$

$$S_k = \rho S_{k-1} + c_k^T W \tilde{c}_k = \rho S_{k-1} + (1 - \gamma_f^{-2}) u_k^2 \quad (60)$$

$$\tilde{e}_k = c_k, e_k = c_k, c_k = [u_k \quad u_k]^T \quad (61), (62)$$

where $C_k$ and $W$ are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

$c_k \in \mathcal{R}^{2 \times 1}$ is a first column vector of $C_k = [c_k, \ldots, c_{k-N+1}]$, $$\tilde{C}_k = \begin{bmatrix} u_k & \cdots & u_{k-N} \\ u_k & \cdots & u_{k-N} \end{bmatrix} \quad (63)$$

$$\tilde{C}_k(:,1) = c_k = [u_k \quad u_k]^T, \tilde{C}_k(:,i) = \tilde{C}_{k-1}(:,i-1), \quad (64)$$
$i = 2, \ldots, N+1$
$H_k = [u_k, \ldots, u_{k-N+1}]^T,$ $x_k$: a state vector or merely a state; unknown, and this is a target for estimation, $x_0$: an initial state; unknown, $w_k$: system noise; unknown, $v_k$: observation noise; unknown, $y_k$: an observation signal; taken as filter input, and known, $z_k$: an output signal; unknown, $G_k$: a drive matrix; known upon execution, $H_k$: an observation matrix, known, $\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $K_{s,k}$: a filter gain; obtained from a matrix $\Sigma^{\hat{}}_{k|k-1}$, $R_{e,k}$: an auxiliary variable; a 2×2 matrix, N: a dimension (a tap number) of the state vector; provided in advance, $\mu_k^{\hat{}}$: an N+1-th 1×2 row vector of $K^U_k$; obtained by $K^U_k$, W: a weighting matrix; determined by $\gamma_f$, $e_k$: an ex-post forward prediction error; a two-dimensional column vector, $\underline{e}_k$: an ex-post backward prediction error; a two-dimensional column vector, $\gamma_f$: an attenuation level; provided upon designing, and $\mu$: a step size (a relaxation factor); a real number of $\mu > 0$, and provided in advance.

A system identification method according to a sixth embodiment of the present disclosure is a system identification method for performing fast real-time identification for a system from input/output data, in which a filter robust to disturbance is used in such a manner that a maximum energy gain from the disturbance to a filter error is, as an evaluation criterion, set smaller than a given upper limit $\gamma_f^2$, and the filter is, by Expressions (49), (50), (55), (58) below, provided to a state space model represented by Expressions (11) to (13) below to estimate a state estimation value $\hat{x}_{k|k}$ of a state $x_k$ of the system:

$$x_{k+1} = x_k + G_k w_k, w_k, x_k \in \mathcal{R}^N \quad (11)$$

$$y_k = H_k x_k + v_k, y_k, v_k \in \mathcal{R} \quad (12)$$

$$z_k = H_k x_k, z_k \in \mathcal{R}, H_k \in \mathcal{R}^{1 \times N} \quad (13)$$

$$\hat{x}_{k|k} = \hat{x}_{k-1|k-1} + \mu \frac{\tilde{K}_k(:,1)}{R_{e,k}(1,1)} (y_k - H_k \hat{x}_{k-1|k-1}) \quad (49), (50)$$

$$R_{e,k} = R_{e,k-1} + \epsilon_0 c_k c_k^T - c_{k-N} \tilde{\mu}_k \quad (55)$$

$$\begin{bmatrix} \tilde{K}_k \\ \tilde{\mu}_k \end{bmatrix} = \begin{bmatrix} \epsilon_0 c_k \\ \tilde{K}_{k-1} \end{bmatrix} \quad (58)$$

where $C_k$ and $W$ are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

$c_k \in \mathcal{R}^{2 \times 1}$ is a first column vector of $C_k = [c_k, \ldots, c_{k-N+1}]$, $$\tilde{C}_k = \begin{bmatrix} u_k & \cdots & u_{k-N} \\ u_k & \cdots & u_{k-N} \end{bmatrix} \quad (63)$$

$$\tilde{C}_k(:,1) = c_k = [u_k \quad u_k]^T, \tilde{C}_k(:,i) = \tilde{C}_{k-1}(:,i-1), \quad (64)$$
$i = 2, \ldots, N+1$
$H_k = [u_k, \ldots, u_{k-N+1}]^T,$ $x_k$: a state vector or merely a state; unknown, and this is a target for estimation, $x_0$: an initial state; unknown, $w_k$: system noise; unknown, $v_k$: observation noise; unknown, $y_k$: an observation signal; taken as filter input, and known, $z_k$: an output signal; unknown, $G_k$: a drive matrix; known upon execution, $H_k$: an observation matrix, known, $\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $K_{s,k}$: a filter gain; obtained from a matrix $\Sigma^{\wedge}_{k|k-1}$, $R_{e,k}$: an auxiliary variable; a 2×2 matrix, N: a dimension (a tap number) of the state vector; provided in advance, $\tilde{\mu}_k$: an N+1-th 1×2 row vector of $K^U_k$; obtained by $K^U_k$, W: a weighting matrix; determined by $\gamma_f$, $e_k$: an ex-post forward prediction error; a two-dimensional column vector, $\underline{e}_k$: an ex-post backward prediction error; a two-dimensional column vector, $\varepsilon_0$: any positive constant; $\varepsilon_0>0$, and provided in advance, $\gamma_f$: an attenuation level; provided upon designing, and $\mu$: a step size relaxation factor); a real number of $\mu>0$; and provided in advance.

A system identification program according to a seventh embodiment of the present disclosure is a system identification program for causing a computer to execute fast real-time identification for a system from input/output data, causing the computer to execute a step of providing, by a processing section, a filter to a state space model represented by Expressions (11) to (13) below according to Expressions (49) to (62) below, a step of reading, by the processing section, an initial state of a recursive expression from a storage section or receiving the initial state from an input section or an interface section, thereby initializing a recursive variable of the filter, a step of setting, by the processing section, the filter such that a maximum energy gain from disturbance to a filter error is, as an evaluation criterion, set smaller than a given upper limit $\gamma_f^2$ to provide a filter robust to the disturbance and calculating the expressions for providing the filter in descending order to estimate a state estimate value $\hat{x}_{k|k}$ of a state $x_k$ of the system, and a step of storing, by the processing section, the state estimate value $\hat{x}_{k|k}$ in the storage section and/or outputting the state estimate value $\hat{x}_{k|k}$ from an output section or the interface section.

And a recording medium according to the seventh embodiment of the present disclosure is a computer-readable recording medium recording the program.

$$H_k = [u_k, \ldots, u_{k-N+1}]^T,$$

$$x_{k+1} = x_k + G_k w_k, w_k, x_k \in \mathcal{R}^N \quad (11)$$

$$y_k = H_k x_k + v_k, y_k, v_k \in \mathcal{R} \quad (12)$$

$$z_k = H_k x_k, z_k \in \mathcal{R}, H_k \in \mathcal{R}^{1 \times N} \quad (13)$$

$$\hat{x}_{k|k} = \hat{x}_{k-1|k-1} + K_{s,k}(y_k - H_k \hat{x}_{k-1|k-1}) \quad (49)$$

$$K_{s,k} = \frac{\tilde{K}_k(:,1)}{R_{e,k}(1,1)} \quad (50)$$

$$b_k = b_{k-1} - \rho^{-1} \tilde{K}_k W \underline{e}_k \quad (51)$$

$$\underline{S}_k = \rho \underline{S}_{k-1} + \underline{e}_k^T W \tilde{\underline{e}}_k \quad (52)$$

$$\underline{e}_k = \chi_k^{-1} \tilde{\underline{e}}_k \quad (53)$$

$$\chi_k = \rho^{-1} R_{e,k} W \quad (54)$$

$$R_{e,k} = R_{e,k-1} + \frac{\tilde{e}_k \tilde{e}_k^T}{S_{k-1}} - \tilde{e}_k \tilde{\mu}_k \quad (55)$$

$$\tilde{\underline{e}}_k = \underline{S}_{k-1} \tilde{\mu}_k^T \quad (56)$$

$$\tilde{K}_k = \tilde{m}_k - b_{k-1} \tilde{\mu}_k \quad (57)$$

$$\begin{bmatrix} \tilde{m}_k \\ \tilde{\mu}_k \end{bmatrix} = \begin{bmatrix} 0 \\ \tilde{K}_{k-1} \end{bmatrix} + \begin{bmatrix} 1 \\ a_{k-1} \end{bmatrix} \frac{\tilde{e}_k^T}{S_{k-1}} \quad (58)$$

$$a_k = a_{k-1} - \rho^{-1} \tilde{K}_{k-1} W e_k \quad (59)$$

$$S_k = \rho S_{k-1} + e_k^T W \tilde{e}_k \quad (60)$$

$$e_k = \chi_{k-1}^{-1} \tilde{e}_k \quad (61)$$

$$\tilde{e}_k = c_k + C_{k-1} a_{k-1} \quad (62)$$

where $C_k$ and W are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

$e_k \in \mathcal{R}^{2 \times 1}$ is a first column vector of $C_k = [c_k, \ldots, c_{k-N+1}]$, $$\breve{C}_k = \begin{bmatrix} u_k & \ldots & u_{k-N} \\ u_k & \ldots & u_{k-N} \end{bmatrix} \quad (63)$$

$$\breve{C}_k(:,1) = c_k = [u_k \ u_k]^T, \breve{C}_k(:,i) = \breve{C}_{k-1}(:,i-1), \quad (64)$$
$i = 2, \ldots, N+1$ $x_k$: a state vector or merely a state; unknown, and this is a target for estimation, $x_0$: an initial state; unknown, $w_k$: system noise; unknown.

$v_k$: observation noise; unknown, $y_k$: an observation signal; taken as filter input, and known, $z_k$: an output signal; unknown, $G_k$: a drive matrix; known upon execution, $H_k$: an observation matrix, known, $\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $K_{s,k}$: a filter gain; obtained from a matrix $R_{e,k}$: an auxiliary variable; a 2×2 matrix, $\chi_k$: a conversion factor; a 2×2 matrix, N: a dimension (a tap number) of the state vector; provided in advance, μ̃$_k$: an N+1-th 1×2 row vector of K$^U_k$; obtained by K$^U_k$, m$_k$: an N×2 matrix including first to N-th rows of K$^U_k$; obtained by K$^U_k$, W: a weighting matrix; determined by γ$_f$, a$_k$: a forward linear prediction factor; an N-dimensional column vector, b$_k$: a backward linear prediction factor; an N-dimensional column vector, e$_k$: an ex-post forward prediction error; a two-dimensional column vector, e$_k$: an ex-post backward prediction error; a two-dimensional column vector, and γ$_f$: an attenuation level; provided upon designing.

A system identification program according to an eighth embodiment of the present disclosure is a system identification program for causing a computer to execute fast real-time identification for a system from input/output data, causing the computer to execute a step of providing, by a processing section, a filter to a state space model represented by Expressions (11) to (13) below according to Expressions (49), (50), (55), (58), (60) to (62) below, a step of reading, by the processing section, an initial state of a recursive expression from a storage section or receiving the initial state from an input section or an interface section, thereby initializing a recursive variable of the filter, a step of setting, by the processing section, the filter such that a maximum energy gain from disturbance to a filter error is, as an evaluation criterion, set smaller than a given upper limit γ$_f^2$ to provide a filter robust to the disturbance and calculating the expressions for providing the filter in descending order to estimate a state estimate value x̂$_{k|k}$ of a state x$_k$ of the system, and a step of storing, by the processing section, the state estimate value x̂$_{k|k}$ in the storage section and/or outputting the state estimate value x̂$_{k|k}$ from an output section or the interface section.

And a recording medium according to the eighth embodiment of the present disclosure is a computer-readable recording medium recording the program.

$$x_{k+1} = x_k + G_k w_k, w_k, x_k \in \mathcal{R}^N \quad (11)$$

$$y_k = H_k x_k + v_k, y_k, v_k \in \mathcal{R} \quad (12)$$

$$z_k = H_k x_k, z_k \in \mathcal{R}, H_k \in \mathcal{R}^{1 \times N} \quad (13)$$

$$\hat{x}_{k|k} = \hat{x}_{k-1|k-1} + \mu \frac{\tilde{K}_k(:,1)}{R_{e,k}(1,1)}(y_k - H_k \hat{x}_{k-1|k-1}) \quad (49),(50)$$

$$R_{e,k} = R_{e,k-1} + \frac{c_k c_k^T}{S_{k-1}} - c_{k-N} \tilde{\mu}_k \quad (55)$$

$$\begin{bmatrix} \tilde{K}_k \\ \tilde{\mu}_k \end{bmatrix} = \begin{bmatrix} c_k / S_{k-1} \\ \tilde{K}_{k-1} \end{bmatrix} \quad (58)$$

$$S_k = \rho S_{k-1} + c_k^T W \check{c}_k = \rho S_{k-1} + (1 - \gamma_f^{-2}) u_k^2 \quad (60)$$

$$\tilde{e}_k = c_k, e_k = c_k, c_k = [u_k \ u_k]^T \quad (61),(62)$$

where C$_k$ and W are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

c$_k \in \mathcal{R}^{2 \times 1}$ is a first column vector of C$_k$=[c$_k$, ..., c$_{k-N+1}$], $$\check{C}_k = \begin{bmatrix} u_k & \cdots & u_{k-N} \\ u_k & \cdots & u_{k-N} \end{bmatrix} \quad (63)$$

$$\check{C}_k(:,1) = c_k = [u_k \ u_k]^T, \quad (64)$$

$$\check{C}_k(:,i) = \check{C}_{k-1}(:,i-1), i = 2, \ldots, N+1$$

$$H_k = [u_k, \ldots, u_{k-N+1}]^T,$$

x$_k$: a state vector or merely a state; unknown, and this is a target for estimation, x$_0$: an initial state; unknown, w$_k$: system noise; unknown, v$_k$: observation noise; unknown, y$_k$: an observation signal; taken as filter input, and known, z$_k$: an output signal; unknown, G$_k$: a drive matrix; known upon execution, H$_k$: an observation matrix, known, x̂$_{k|k}$: an estimation value, using observation signals y$_0$ to y$_k$, of the state x$_k$ (an impulse response of an unknown system) at time k; provided by a filter equation, x̂$_{k|k}$: a single-step prediction value, using the observation signals y$_0$ to y$_k$, of a state x$_{k+1}$ at the time k; provided by the filter equation, x̂$_{-1|-1}$: an initial estimation value of the state; unknown in a normal situation, but zero is used for convenience, K$_{s,k}$: a filter gain; obtained from a matrix Σ̂$_{k|k-1}$, R$_{e,k}$: an auxiliary variable; a 2×2 matrix, N: a dimension (a tap number) of the state vector; provided in advance, μ̃$_k$: an N+1-th 1×2 row vector of K$^U_k$; obtained by K$^U_k$, W: a weighting matrix; determined by γ$_f$, e$_k$: an ex-post forward prediction error; a two-dimensional column vector, e$_k$: an ex-post backward prediction error; a two-dimensional column vector, γ$_f$: an attenuation level; provided upon designing, and μ: a step size (a relaxation factor); a real number of μ>0, and provided in advance.

A system identification program according to a ninth embodiment of the present disclosure is a system identification program for causing a computer to execute fast real-time identification for a system from input/output data, causing the computer to execute a step of providing, by a processing section, a filter to a state space model represented by Expressions (11) to (13) below according to Expressions (49), (50), (55), (58) below, a step of reading, by the processing section, an initial state of a recursive expression from a storage section or receiving the initial state from an input section or an interface section, thereby initializing a recursive variable of the filter, a step of setting, by the processing section, the filter such that a maximum energy gain from disturbance to a filter error is, as an evaluation criterion, set smaller than a given upper limit γ$_f^2$ to provide a filter robust to the disturbance and calculating the expressions for providing the filter in descending order to estimate a state estimate value x̂$_{k|k}$ of a state x$_k$ of the system, and a step of storing, by the processing section, the state estimate value x̂$_{k|k}$ in the storage section and/or outputting the state estimate value x̂$_{k|k}$ from an output section or the interface section.

And a recording medium according to the ninth embodiment of the present disclosure is a computer-readable recording medium recording the program.

$$x_{k+1} = x_k + G_k w_k, w_k, x_k \in \mathcal{R}^N \quad (11)$$

$$y_k = H_k x_k + v_k, y_k, v_k \in \mathcal{R} \quad (12)$$

$$z_k = H_k x_k, z_k \in \mathcal{R}, H_k \in \mathcal{R}^{1 \times N} \quad (13)$$

$$\hat{x}_{k|k} = \hat{x}_{k-1|k-1} + \mu \frac{\tilde{K}_k(:,1)}{R_{e,k}(1,1)}(y_k - H_k \hat{x}_{k-1|k-1}) \quad (49),(50)$$

$$R_{e,k} = R_{e,k-1} + \epsilon_0 c_k c_k^T - c_{k-N} \tilde{\mu}_k \quad (55)$$

$$\begin{bmatrix} \tilde{K}_k \\ \tilde{\mu}_k \end{bmatrix} = \begin{bmatrix} \epsilon_0 c_k \\ \tilde{K}_{k-1} \end{bmatrix} \quad (58)$$

where $C_k$ and W are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

$c_k \in \mathcal{R}^{2 \times 1}$ is a first column vector of $C_k = [c_k, \ldots, c_{k-N+1}]$, $$\check{C}_k = \begin{bmatrix} u_k & \cdots & u_{k-N} \\ u_k & \cdots & u_{k-N} \end{bmatrix} \quad (63)$$

$$\check{C}_k(:,1) = c_k = [u_k \ u_k]^T, \quad (64)$$
$$\check{C}_k(:,i) = \check{C}_{k-1}(:,i-1), i = 2, \ldots, N+1$$
$$H_k = [u_k, \ldots, u_{k-N+1}]^T,$$

$x_k$: a state vector or merely a state; unknown, and this is a target for estimation, $x_0$: an initial state; unknown, $w_k$: system noise; unknown, $v_k$: observation noise; unknown, $y_k$: an observation signal; taken as filter input, and known, $z_k$: an output signal; unknown, $G_k$: a drive matrix; known upon execution, $H_k$: an observation matrix, known, $\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $K_{s,k}$: a filter gain; obtained from a matrix $\Sigma^\wedge_{k|k-1}$, $R_{e,k}$: an auxiliary variable; a 2×2 matrix, N: a dimension (a tap number) of the state vector; provided in advance, $\tilde{\mu}_k$: an N+1-th 1×2 row vector of $K^U_k$; obtained by $K^U_k$, W: a weighting matrix; determined by $\gamma_f$, $e_k$: an ex-post forward prediction error; a two-dimensional column vector, $\underline{e}_k$: an ex-post backward prediction error; a two-dimensional column vector, $\epsilon_0$: any positive constant; $\epsilon_0 >$, and provided in advance, $\gamma_f$: an attenuation level; provided upon designing, and $\mu$: a step size (a relaxation factor); a real number of $\mu > 0$, and provided in advance.

According to the aspect of the present disclosure, a large-sized acoustic or communication system can be identified with high accuracy at high speed. Moreover, according to the aspect of the present disclosure, e.g.; the system identification method and the system identification device for implementing such identification can be applied to a feedback canceller.

1. Summary

According to the identification method of the aspect of the present disclosure and/or the present embodiment, an unknown system can be identified in real time from input/output data with high accuracy at high speed. Moreover, whiteness assumption for an input signal can be properly introduced into the present identification method. Thus, an algorithm can be effectively simplified, and therefore, a computational complexity can be significantly reduced. These are effective for a feedback canceller of a closed loop system such as a hearing aid.

According to the aspect of the present disclosure and/or the present embodiment, the following can be provided, for example:

1) the method, the device, the program, and the recording medium for identifying the unknown system in real time from the input/output data with high accuracy at high speed;

2) the system identification method configured so that whiteness assumption can be introduced for the input signal and the computational complexity can be significantly reduced; and 3) the feedback canceller of the closed loop system such as the hearing aid.

Moreover, in the aspect of the present disclosure and/or the present embodiment conversion factors of an ex-ante linear prediction error and an ex-post linear prediction error of the input signal are utilized, and therefore, a C-fast $H_\infty$ filter (Conversion Factor-based Fast $H_\infty$ Filter: C-FHF) for reducing the computational complexity O(11N) of the previously-proposed fast $H_\infty$ filter (FHF) to O(7N) is derived. Further, according to the aspect of the present disclosure and/or the present embodiment, whiteness assumption for the input signal is introduced to provide a C-whiten fast $H_\infty$ filter (Conversion Factor-based Whiten Fast $H_\infty$ Filter: C-WFHF) for reducing the computational complexity to O(2N). Moreover, a C-NLMS algorithm (Conversion Factor-based Normalized Least Mean Square Algorithm) is provided as a special case.

The fast identification method according to the aspect of the present disclosure and/or the present embodiment is applicable to identification of large-sized acoustic and communication systems. The fast identification method is effective for an acoustic echo canceller, active noise control, and sound field reproduction in a smart speaker and a teleconferencing system, for example. Moreover, in the present identification method, whiteness assumption for the input signal can be properly introduced. Thus, the algorithm can be effectively simplified, and the computational complexity can be significantly reduced. These simplified algorithms are effective for the feedback canceller of the closed loop system such as the hearing aid and a full-duplex relay station for high-speed data communication.

2. Description of Signs

First, main signs used in the present embodiment will be described.

$x_k$: a state vector or merely a state; unknown, this is a target for estimation.

$x_0$: an initial state; unknown.

$w_k$: system noise; unknown.

$y_k$: observation noise; unknown.

$y_k$: an observation signal; taken as filter input, known.

$z_k$: an output signal; unknown.

$G_k$: a drive matrix; known upon execution.

$H_k$: an observation matrix, known ($H_k=[u_k, \ldots, u_{k-N+1}]^T$).

$\hat{x}_{k|k}$: an estimation value, using observation signals $y_0$ to $y_k$, of the state $x_k$ (an impulse response of an unknown system) at time k; provided by a filter equation.

$\hat{z}_{k|k}$: an estimation value $H_k\hat{x}_{k|k}$, using the observation signals $y_0$ to $y_k$, of output $z_k$ at the time k; provided by the filter equation.

$\hat{z}_{k|k-1}$: a single-step prediction value $H_k\hat{x}_{k-1|k-1}$, using the observation signals $y_0$ to $y_{k-1}$, of the output $z_k$ at the time k; provided by the filter equation.

$\hat{x}_{k+1|k}$: a single-step prediction value, using the observation signals $y_0$ to $y_k$, of a state $x_{k+1}$ at the time k; provided by the filter equation.

$\hat{x}_{-1|-1}$: an initial estimation value of the state; unknown in a normal situation, but zero is used for convenience.

$\Sigma\hat{}_{k|k}$: corresponding to a covariance matrix of an error of $\hat{x}_{k|k}$; provided by a Riccati equation.

$\Sigma\hat{}_{k+1|k}$: corresponding to a covariance matrix of an error of $\hat{x}_{k+1|k}$; provided by the Riccati equation.

$\Sigma\hat{}_{0|-1}$: corresponding to a covariance matrix of an initial state; unknown in a normal situation, but $\varepsilon_0 I$, $\varepsilon_0>0$ is used for convenience.

$K_{s,k}$: a filter gain; obtained from a matrix $\Sigma\hat{}_{k|k-1}$ or a gain matrix $K_k$.

$\rho$: a forgetting factor; when $\gamma_f$ is determined, determined by $\rho=1-\chi(\gamma_f)$, and can be also determined independently of $\gamma_f$.

$\mu$: a step size (a relaxation factor); a real number of $\mu>0$, and provided in advance.

$\Sigma_0^{-1}$: an inverse matrix of a weighting matrix representing uncertainty of the state; $\Sigma_0=\varepsilon_0 I$, $\varepsilon_0>0$ is used for convenience.

$e_{f,i}$: a filter error; $e_{f,i}=z^v_{i|i}-H_i x_i$, $z^v_{i|i}$ is an output estimation value $H_i\hat{x}_{i|i}$.

$R_{e,k}$: an auxiliary variable; a 2×2 matrix.

$\chi_k$: a conversion factor; a 2×2 matrix.

N: the dimension (the tap number) of the state vector; provided in advance.

$\mu\tilde{}_k$: an N+1-th 1×2 row vector of $K^U_k$; obtained by $K^U_k$.

$m_k$: an N×2 matrix including first to N-th rows of $K^U_k$; obtained by $K^U_k$.

$\gamma_f$: an attenuation level; provided upon designing.

W: the weighting matrix; determined by $\gamma_f$.

$a_k$: a forward linear prediction factor; an N-dimensional column vector.

$b_k$: a backward linear prediction factor; an N-dimensional column vector.

$e_k$: an ex-post forward prediction error; a two-dimensional column vector.

$\underline{e}_k$: an ex-post backward prediction error; a two-dimensional column vector.

$\varepsilon_0$: any positive constant; $\varepsilon_0>0$, and provided in advance.

O: a computational complexity (an order); when the number of times of multiplication is, e.g., $N^2+2N+3$, represented as $O(N^2)$.

Note that "^" or "˜" assigned to above a sign means an estimation value. Moreover, "~," "_," "U," etc. are signs assigned for convenience. For convenience of input, these signs are described on an upper right side of characters, but as indicated by mathematical expressions, are the same: as those described just above characters. Moreover, x, w, H, G, K, R, $\Sigma$, etc. are vectors or matrices, and as indicated by the mathematical expressions, are indicated as thick characters. Note that for convenience of input, these signs are sometimes described as normal characters.

2. Hardware and Program for System Identification

The system identification method and the system identification device and system of the present embodiment can be provided by, e.g., a system identification program for causing a computer to execute each step, a computer-readable recording medium recording the system identification program, a program product including the system identification program and configured loadable in an internal memory of the computer, and a computer including the program, such as a server. The recording medium is, for example, a non-transitory recording medium configured to hold recorded contents even when a power supply is blocked. The recording medium may be, for example, a hard disk drive, a ROM, a RAM, and a detachable USB flash memory.

Figure 14:
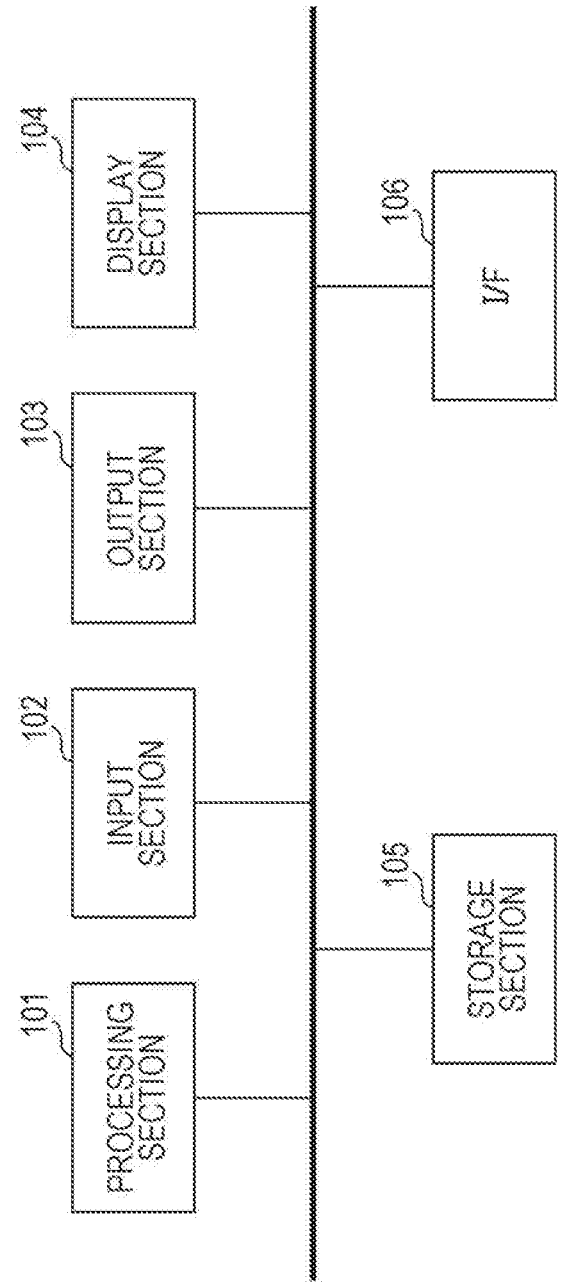
FIG. 14 is a configuration diagram of hardware regarding the present embodiment.

FIG. 14 is a configuration diagram of hardware regarding the present embodiment.

This hardware has a processing section 101 as a central processing unit (CPU), an input section 102, an output section 103, a display section 104, a storage section 105, and an interface section (I/F) 106. Moreover, the processing section 101, the input section 102, the output section 103, the display section 104, the storage section 105, and the interface section (I/F) 106 are connected to each other via an appropriate connection section such as a star type or a bus type. In the storage section 105, the known data described in "2. Description of Signs" for system identification is stored as necessary. The unknown and known data, data regarding each filter, such as a calculated C-fast $H_\infty$ filter, of the present embodiment, and other types of data are written in and/or read from the storage section 105 as necessary by the processing section 101. The processing section 101 executes calculation processing according to an expression representing each filter of the present embodiment based on the input/output data, thereby estimating (identifying) a mathematical model of an input/output relationship of the system. The processing section 101 can obtain a state estimation value and an output prediction value, for example.

3. Technique of Identification Method in connection with Present Embodiment

For distinguishing from a normal $H_\infty$ filter, a $H_\infty$ filter further optimized regarding a model set and a weight set will be specifically referred to as a hyper $H_\infty$ filter (Non-Patent Documents 2 to 4). This $H_\infty$ filter has such characteristics that the $H_\infty$ filter is applicable even in a case where state dynamics are unknown.

[Hyper $H_\infty$ Filter]

State Space Model $$x_{k+1} = x_k + G_k w_k, w_k, x_k \in \mathcal{R}^N \quad (11)$$

$$y_k = H_k x_k + v_k, y_k, v_k \in \mathcal{R} \quad (12)$$

$$z_k = H_k x_k, z_k \in \mathcal{R}, H_k \in \mathcal{R}^{1 \times N} \quad (13)$$

$$\sup_{x_{ij},[w_i],[v_i]} \frac{\sum_{i=0}^{k} \|e_{f,i}\|^2/\rho}{\|x_0-\check{x}_0\|^2_{\Sigma_{ij}^{-1}} + \sum_{i=0}^{k}\|w_i\|^2 \sum_{i=0}^{k}\|v_i\|^2/\rho} < \gamma_f^2 \quad (14)$$

The state estimation value $\hat{x}_{k|k}$ (or the output estimation value $z^v_{k|k}$) consistent with Expressions (11), (12), (13), and

(14) is provided by the following level $\gamma_f$ of the hyper $H_\infty$ filter.

$$\hat{z}_{k|k} = H_h \hat{\chi}_{k|k} \quad (15)$$

$$\hat{\chi}_{k|k} = \hat{\chi}_{k-1|k-1} + K_{s,k}(y_k - H_k \hat{\chi}_{k-1|k-1}) \quad (16)$$

$$K_{s,k} = \hat{\Sigma}_{k|K-1} H_k^T (H_k \hat{\Sigma}_{k|k-1} H_k^T + \rho)^{-1} \quad (17)$$

$$\hat{\Sigma}_{k|k} = \hat{\Sigma}_{k|k-1} - \hat{\Sigma}_{k|k-1} C_k^T R_{e,k}^{-1} C_k \hat{\Sigma}_{k|k-1}$$

$$\hat{\Sigma}_{k+1|k} = \hat{\Sigma}_{k|k}/\rho \quad (18)$$

The following relational expression is satisfied herein.

$$e_{f,i} = \check{z}_{i|i} - H_i x_i, \ \hat{x}_{-1|-1} = 0, \ \Sigma_{0|-1} = \Sigma_0 \quad (19)$$
$$R_{e,k} = R + C_k \hat{\Sigma}_{k|k-1} C_k^T$$
$$R = \begin{bmatrix} \rho & 0 \\ 0 & -\rho\gamma_f^2 \end{bmatrix}, \ C_k = \begin{bmatrix} H_k \\ H_k \end{bmatrix}$$
$$0 < \rho = 1 - \chi(\gamma_f) \le 1, \ \gamma_f \ge 1 \quad (20)$$

$\chi(\gamma_f)$ is a monotone attenuation function of $\gamma_f$ satisfying $\chi(1)=1$, $\chi(\infty)=0$. Moreover, the drive matrix $G_k$ is generated as follows.

$$G_k G_k^T = \frac{\chi(\gamma_f)}{\rho} \hat{\Sigma}_{k|k} \quad (21)$$

Note that the following existence condition needs to be satisfied.

$$\hat{\Sigma}_{i|i}^{-1} = \hat{\Sigma}_{i|i-1}^{-1} + \frac{1-\gamma_f^{-2}}{\rho} H_i^T H_i > 0, \ i = 0, \ldots, k \quad (22)$$

The characteristics of the hyper $H_\infty$ filter include the following five important properties for an echo canceller (state estimation):
1) convergence:
2) tracking performance for echo path change;
3) robustness to a near-end signal;
4) insensitiveness to input signal characteristics; and
5) adjustable numerical stability.

FIG. 1 is a graph for describing distribution and properties of a solution in a $\gamma_f$-$\sigma_w^2$ space.

Each circle mark of FIG. 1 indicates the solution of the hyper $H_\infty$ filter in a parameter space. The solutions each correspond to hyper $H_\infty$ filters having different values of $\gamma_f$ and $\sigma_w^2$. Specifically, the solution on a line $\gamma_f=\infty$ is coincident with a forgetting factor RLS algorithm, and the solution on a point $(\gamma_f, \sigma_w^2)=(1, 0)$ is coincident with an NLMS algorithm with a step size of 1. Thus, it is shown that the hyper $H_\infty$ filter includes NLMS and RLS as typical adaptable algorithms.

The computational complexity of the hyper filter is $O(N^2)$, and therefore, is not suitable for real-time processing without change. However, a fast algorithm with a computational complexity $O(N)$ in a case where the observation matrix $H_k$ has shift characteristics $H_k=[u_k, H_{k-1}(1), H_{k-1}(2), \ldots, H_{k-1}(N-1)]$ has been developed (Non-Patent Document 2, Non-Patent Document 3).

[Fast $H_\infty$ Filter]

When the observation matrix $H_k$ satisfies the shift characteristics, the hyper $H_\infty$ filter having $\Sigma_0 = \varepsilon_0 I > 0$ can be executed by the following expression.

$$\hat{x}_{k|k} = \hat{x}_{k-1|k-1} + K_{s,k}(y_k - H_k \hat{x}_{k-1|k-1}) \quad (23)$$

$$K_{s,k} = \frac{K_k(:,1)}{1 + \gamma_f^{-2} H_k K_k(:,1)} \in \mathcal{R}^{N \times 1} \quad (24)$$

$$K_k = m_k - b_k \mu_k \in \mathcal{R}^{N \times 2} \quad (25)$$
$$b_k = [b_{k-1} - m_k W \tilde{e}_k][1 - \mu_k W \tilde{e}_k]^{-1}$$

$$\tilde{e}_k = c_{k-N} + C_k b_{k-1} \quad (26)$$

$$\begin{bmatrix} m_k \\ \mu_k \end{bmatrix} = \check{K}_k, \ m_k \in \mathcal{R}^{N \times 2}, \ \mu_k \in \mathcal{R}^{1 \times 2} \quad (27)$$

$$\check{K}_k = \begin{bmatrix} S_k^{-1} e_k^T \\ K_{k-1} + a_k S_k^{-1} e_k^T \end{bmatrix} \quad (28)$$

$$S_k = \rho S_{k-1} + e_k^T W \tilde{e}_k, \ e_k = c_k + C_{k-1} a_k \quad (29)$$
$$a_k = a_{k-1} - K_{k-1} W \tilde{e}_k, \ \tilde{e}_k = c_k + C_{k-1} a_{k-1}$$

Note that $C_k$ and $W$ are defined by the following expressions.

$$C_k = \begin{bmatrix} H_k \\ H_k \end{bmatrix}, \ W = \begin{bmatrix} 1 & 0 \\ 0 & -\gamma_f^{-2} \end{bmatrix}$$

$c_k \in R^{2 \times 1}$ is a first column vector of $C_k = [c_k, \ldots, c_{k-N+1}]$. Supposing that $c_{k-i} = 0_{2 \times 1}$, $k-i < 0$, initial values are set as in $K_{-1} = 0_{N \times 2}$, $a_{-1} = 0_{N \times 1}$, $S_{-1} = 1/\varepsilon_0$, $\varepsilon_0 > 0$, $b_{-1} = 0_{N \times 1}$, $\hat{x}_{-1|-1} = 0_{N \times 1}$. $0_{m \times n}$ described herein indicates a m×n zero matrix.

At this point, the following scalar existence condition must be satisfied.

$$-\theta \hat{\Xi}_i + \rho \gamma_f^2 > 0, \ i=0, \ldots, k \quad (30)$$

At this point, $\theta$, $\hat{\Xi}_i$ are defined by the following expressions.

$$\varrho = 1 - \gamma_f^2, \ \hat{\Xi}_i = \frac{\rho H_i K_{s,i}}{1 - H_i K_{s,i}} = \frac{\rho H_i K_i(:,1)}{1 - (1 - \gamma_f^{-2}) H_i K_i(:,1)} \quad (31)$$

4. Technique of Identification Method of Present Embodiment 4.1 Preparation

Some propositions for deriving a new algorithm of the fast $H_\infty$ filter are shown. For proving these propositions, a $(N+1) \times (N+1)$ matrix $Q^U_k$ defined as follows is utilized.

$$\check{Q}_k = \frac{\rho^{k+1}}{\varepsilon_0} \check{\Omega}^{-1} + \sum_{i=0}^{k} \rho^{k-i} \check{C}_i^T W \check{C}_i^T W \check{C}_i \quad (32)$$

Note that the following relationship expression is satisfied.

$$\check{C}_i := [C_i c_{i-N}] = [c_i C_{i-1}], \ \check{\Omega} := \text{diag}\{\rho, \ldots, \rho^{N+1}\}$$

The matrix $Q^U_k$ can be resolved into the following two ways from the shift characteristics of the observation matrix $C^U_i$.

$$\check{Q}_k = \begin{bmatrix} Q_k & t_k \\ t_k^T & q_k^b \end{bmatrix} = \begin{bmatrix} q_k^f & t_k^T \\ t_k & Q_{k-1} \end{bmatrix} \quad (33)$$

$Q_k$ and $Q_{k-1}$ described herein are N×N block matrices, and $t_k$ and $t_k$ are N×1 block matrices. Moreover, $q_k^f$ and $q_k^b$ are 1×1 block matrices (scalars).

The resolved $Q_k^U$ is recursively obtained by the following expression.

$$\check{Q}_k = \rho \check{Q}_{k-1} + \check{C}_k^T W \check{C}_k \quad (34)$$

Note that W is defined by the following expression.

$$W = \begin{bmatrix} 1 & 0 \\ 0 & -\gamma_f^{-2} \end{bmatrix} \quad (35)$$

First Proposition

The gain matrix $K_k := Q_k^{-1} C_k^T$ can be represented as follows by means of a pseudo gain matrix $\tilde{K}_k := Q_{k-1}^{-1} C_k^T$.

$$K_k = \tilde{K}_k R_{e,k}^{-1} W^{-1}, \quad R_{e,k} = R + C_k Q_{k-1}^{-1} C_k^T \quad (36)$$

The 2×2 matrix R described herein is defined by the following expression.

$$R = \rho W^{-1} \quad (37)$$

Second Proposition

A new update expression of the backward linear prediction factor $b_k := -Q_k^{-1} t_k$ is provided by the following expression.

$$b_k = b_{k-1} - K_k W \underline{e}_k \quad (38)$$

Third Proposition

The ex-post backward prediction error $\underline{e}_k$ can be represented as follows by means of an ex-ante backward prediction error $\underline{\tilde{e}}_k$.

$$\underline{e}_k = \chi_k^{-1} \underline{\tilde{e}}_k \quad (39)$$

The conversion factor matrix $\chi_k$ in two rows and two columns as described herein is defined by the following expression.

$$\chi_k = \rho^{-1} R_{e,k} W \quad (40)$$

Fourth Proposition

The ex-post forward prediction error $e_k$ can be represented as means of an ex-ante forward prediction error $\tilde{e}_k$.

$$e_k = \chi_{k-1}^{-1} \tilde{e}_k \quad (41)$$

Fifth Proposition

The backward linear prediction factor $b_k$ can be recursively updated as follows by means of the ex-post backward prediction error $\underline{e}_k$.

$$b_k = b_{k-1} - \rho^{-1} \tilde{K}_k W \underline{e}_k \quad (42)$$

Sixth Proposition

The forward linear prediction factor $a := -Q_{k-1}^{-1} t_k$ can be recursively updated by the following expression by means of the ex-post forward prediction error $e_k$.

$$a_k = a_{k-1} - \rho^{-1} \tilde{K}_{k-1} W e_k \quad (43)$$

Seventh Proposition

Another form for calculating the pseudo gain matrix $\tilde{K}_k$ is provided by the following expression.

$$\tilde{K}_k = \tilde{m}_k - b_{k-1} \tilde{\mu}_k \quad (44)$$

The N×2 matrix $\tilde{m}_k$ and the 1×2 matrix $\tilde{\mu}_k$ described herein are defined by the following expression.

$$\begin{bmatrix} \tilde{m}_k \\ \tilde{\mu}_k \end{bmatrix} = \begin{bmatrix} 0 \\ \tilde{K}_{k-1} \end{bmatrix} + \begin{bmatrix} 1 \\ a_{k-1} \end{bmatrix} \frac{\tilde{e}_k^T}{S_{k-1}} \quad (45)$$

Eighth Proposition

The ex-ante backward prediction error $\underline{\tilde{e}}_k$ can be represented as follows by means of $\tilde{\mu}_k$.

$$\underline{\tilde{e}}_k = \underline{S}_{k-1} \hat{\tilde{\mu}}_k^T \quad (46)$$

Ninth Proposition

The 2×2 matrix $R_{e,k}$ of Expression (36) can be recursively updated by the following expression.

$$R_{e,k} = R_{e,k-1} + \frac{\tilde{e}_k \tilde{e}_k^T}{S_{k-1}} - \tilde{e}_k \tilde{\mu}_k \quad (47)$$

4.2 Derivation of Algorithm

Using the first to ninth propositions, the new fast $H_\infty$ filter (the C-fast $H_\infty$ filter) for updating the forward linear prediction factor $a_k$ and the backward linear prediction factor $b_k$ by means of the ex-post forward prediction error $e_k$ and the ex-post backward prediction error $\underline{e}_k$ is obtained as follows.

$$\hat{z}_{k|k} = H_k \hat{x}_{k|k} \quad (48)$$

$$\hat{x}_{k|k} = \hat{x}_{k-1|k-1} + K_{s,k}(y_k - H_k \hat{x}_{k-1|k-1}) \quad (49)$$

$$K_{s,k} = \frac{\tilde{K}_k(:,1)}{R_{e,k}(1,1)} \quad (50)$$

$$b_k = b_{k-1} - \rho^{-1} \tilde{K}_k W \underline{e}_k \quad \text{(Fifth Proposition)} \quad (51)$$

$$\underline{S}_k = \rho \underline{S}_{k-1} + \underline{e}_k^T W \underline{\tilde{e}}_k \quad (52)$$

$$\underline{e}_k = \chi_k^{-1} \underline{\tilde{e}}_k \quad \text{(Third Proposition)} \quad (53)$$

$$\chi_k = \rho^{-1} R_{e,k} W \quad (54)$$

$$R_{e,k} = R_{e,k-1} + \frac{\tilde{e}_k \tilde{e}_k^T}{S_{k-1}} - \tilde{e}_k \tilde{\mu}_k \quad (\square \text{ Ninth Proposition}) \quad (55)$$

$$\underline{\tilde{e}}_k = \underline{S}_{k-1} \tilde{\mu}_k^T \quad (\square \text{ Eighth Proposition}) \quad (56)$$

$$\tilde{K}_k = \tilde{m}_k - b_{k-1} \tilde{\mu}_k \quad (\square \text{ Seventh Proposition}) \quad (57)$$

$$\begin{bmatrix} \tilde{m}_k \\ \tilde{\mu}_k \end{bmatrix} = \begin{bmatrix} 0 \\ \tilde{K}_{k-1} \end{bmatrix} + \begin{bmatrix} 1 \\ a_{k-1} \end{bmatrix} \frac{\tilde{e}_k^T}{S_{k-1}} \quad (58)$$

$$a_k = a_{k-1} - \rho^{-1} \tilde{K}_{k-1} W e_k \quad (\square \text{ Sixth Proposition}) \quad (59)$$

$$S_k = \rho S_{k-1} + e_k^T W \tilde{e}_k \quad (60)$$

$$e_k = \chi_{k-1}^{-1} \tilde{e}_k \quad (\square \text{ Fourth Proposition}) \quad (61)$$

$$\tilde{e}_k = c_k + C_{k-1} a_{k-1} \quad (62)$$

Note that setting and initialization of each parameter are the same as those in the case of the fast $H_\infty$ filter. The C-fast $H_\infty$ filter corresponds to an ex-post prediction error form of the fast $H_\infty$ filter using the conversion factor $\chi_k$.

4.3 Evaluation of Computational Complexity

The C-fast $H_\infty$ filter is theoretically equivalent to the fast $H_\infty$ filter. However, the C-fast $H_\infty$ filter only needs a small computational complexity. A C-whiten fast $H_\infty$ filter is a C-fast $H_\infty$ filter for significantly reducing the algorithm on the assumption that the input signal is white. The C-NLMS algorithm corresponds to the C-whiten fast $H_\infty$ filter when the parameters are specific values, and is theoretically equivalent to the NLMS algorithm. Note that the C-NLMS algorithm only needs a computational complexity of O(2N).

FIG. 9 illustrates a table (Table 1) for describing the processing and time complexity of the fast $H_\infty$ filter.

The number of times of multiplication and addition used for calculation of each expression of the fast $H_\infty$ filter is summarized in FIG. 9 (Table 1) (see Patent Document 1, described for comparison). For executing the fast $H_\infty$ filter, mathematical expressions in the table are calculated from top to bottom (in descending order from a greater expression number to a smaller expression number) according to Core Algorithm of FIG. 2, and in this manner, the filter per sample (per unit time) can be executed. This order of expressions is reversed as that of description of a general filter. Note that in each table, "Mul" indicates the number of times of integration, and "Add." indicates the number of times of addition.

FIG. 10 illustrates a table (Table 2) for describing the processing and time complexity of the C-fast $H_\infty$ filter.

FIG. 10 (Table 2) illustrates the number of times of multiplication and addition for the C-fast $H_\infty$ filter. For calculation of the number of times of data processing as described herein, the structures of $K_k$, $C_k$, $\tilde{e}_k$, $e_k$, and W are utilized. For example, $K_{k-1}W\tilde{e}_k$ is replaced with $(1-\gamma_f^{-2})$ $K_{k-1}(:,1)\tilde{e}_k(1,1)$ by means of $K_{k-1}(:,1)=K_{k-1}(:,2)$ and $\tilde{e}_k(1,1)=\tilde{e}_k(2,1)$. Similarly, for obtaining the product of $C_{k-1}$ and $a_{k-1}$, $C_{k-1}(2,:)a_{k-1}$ is replaced with $C_k-1(1,:)a_{k-1}$. In a case where there are multiple multiplications of the same combination of two terms, only the first calculation is counted, $\chi_k^{-1}$ calculated at the previous step is used for $\chi_{k-1}^{-1}$. Vector division using a scalar is processed as vector multiplication using the inverse of the scalar. The number of times of addition is calculated in a similar manner.

In the case of sufficiently-large N, the C-fast $H_\infty$ filter can be executed only with 7N multiplications and 7N additions per unit sample. On the other hand, the fast $H_\infty$ filter is executed with 11N multiplications and 10N additions per unit sample. In both filters, three multiplications are executed per unit sample. In any fast $H_\infty$ filter, a space computational complexity (a memory) is O(6N).

4.4 Processing of Fast $H_\infty$ filter Group

FIG. 2 illustrates a flow chart of the processing of obtaining $\hat{x}_{k|k}$, $\hat{z}_{k|k-1}=H_k\hat{x}_{k-1|k-1}$ according to a fast $H_\infty$ filter group. The fast filter group described herein indicates, for example, the C-fast $H_\infty$ filter (C-FHF), the C-whiten fast $H_\infty$ filter (C-WFHF), and a C-NLMS algorithm filler. As described later in this flowchart, the function of checking the existence condition as illustrated in FIG. 3 might be added to the fast $H_\infty$ filter and the C-fast $H_\infty$ filter. As necessary, $\hat{z}_{k|k}$ is obtained.

Hereinafter, the processing of the fast $H_\infty$ filter group will be described with reference to the flowchart.

[Step S101, Initialization]

The processing section 101 initializes the recursive variable of the fast $H_\infty$ filter. For example, the processing section 101 reads an initial state of a recursive expression from the storage section 105, or receives the initial state from the input section 102 or the I/F 106. In this manner, setting is made as illustrated in the figure.

[Step S103]

The processing section 101 determines whether or not a data length exceeds a data length L determined in advance. For example, the processing section 101 compares the time k and a data quantity L with each other. Note that L can indicate the preset maximum data quantity. When the time k is equal to or less than the data quantity L, the processing section 101 proceeds to a subsequent step S105. When the time k exceeds the data quantity L, the processing section 101 initializes the filter gain, and restarts or terminates the filter (S113). Note that the processing section 101 can remove an unnecessary conditional statement. Alternatively, the processing section 101 may restart the processing as necessary.

[Step S105, Input]

When the time k is equal to or less than L, the processing section 101 updates the augmented observation matrix $\check{C}^U_k$ by means of the input signal and the shift characteristics. For example, the processing section 101 receives the input signal $u_k$ from the input section 102 or the I/F 106, and sets $\check{C}^U_k$ as illustrated in the figure. Note that the processing section 101 may read the input signal $u_k$ from the storage section 105.

A 2×(N+1) augmented observation matrix including the input signal $u_k$ is as follows.

$$\check{C}_k = \begin{bmatrix} u_k & \cdots & u_{k-N} \\ u_k & \cdots & u_{k-N} \end{bmatrix} \quad (63)$$

Utilizing the above-described shift characteristics $\check{C}_k=[c_k, C_{k-1}]=[C_k, c_{k-N}]$, $\check{c}_k$ can be efficiently updated as follows.

$$\check{C}_k(:,1)=c_k=[u_k u_k]^T, \check{C}_k(:,1)=\check{C}_{k-1}(:,i-1), i=2, \ldots, N+1 \quad (64)$$

[Step S107, Core Algorithm]

According to Core Algorithm, the processing section 101 executes any of the algorithms of FIGS. 9 (Table 1) to 12 (Table 4), FIG. 15, and FIG. 16 (details will be described later). Note that in any of these algorithms, the processing section 101 may update the state estimation value $\hat{x}_{k|k}$ with the relaxation factor (the step size) μ (μ described herein is a real number of μ>0). In this case, the processing section 101 multiplies, for example, the second term on the right-hand side of Expression (49) by μ, and in this manner, updating with the relaxation factor (the step size) μ can be implemented. As necessary, the processing section 101 may implement, at optional timing such as before or after execution of the algorithm, the processing of determining the existence condition as illustrated in FIG. 3 (details will be described later).

[Step S109, Estimation Value]

The processing section 101 stores, in the storage section 105, the state estimation value $\hat{x}_{k|k}$ (or the output estimation value $\hat{z}_{k|k}$) calculated at S107, and/or outputs such a value from the output section 103 or the I/F 106.

[Step S111]

The processing section 101 advances the time k (k=k+1), and then, returns to S103. The processing section 101 repeats the processing as long as data is present, or repeats the processing a predetermined number of times.

Note that as necessary, the processing section 101 may store, in the storage section 105, an appropriate intermediate value, an appropriate final value, an appropriate existence condition value, etc. obtained at each step such as the steps S105 to S109, and may read these values from the storage section 105. Further, the processing section 101 may produce, e.g., data, a graph, and/or a figure using each value according to an instruction from the input section 102 or the I/F 106 or according to preset processing, and may store the data, the graph, and/or the figure in the storage section 105 and/or output the data, the graph, and/or the figure from the output section 103 or the I/F 106.

FIG. 3 is flowchart regarding checking of the scalar existence condition.

The function of checking the existence condition as illustrated in FIG. 3 may be added to the flowchart of FIG. 2. For example, the processing section 101 may execute the illustrated step of determining the scalar existence condition at appropriate timing such as before or after execution of the processing of S107, and when Expression (30) is not satisfied, may terminate or restart the processing. Note that this step can be also executed by the processing section 101 at appropriate timing such as appropriate one or more steps of the flowchart of FIG. 2 or timing before or after of the step (S111) for advancing the time k in the flowchart of FIG. 2. Note that in the figure, EXC(k) corresponds to the left-hand side of Expression (30) described above.

4.5 Introduction of Whiteness Assumption

FIG. 11 illustrates a table (Table 3) for describing the processing and time complexity of the C-whiten fast $H_\infty$ filter introducing the relaxation factor $\mu$.

It is assumed that the input signal is white noise, and therefore, the linear prediction factors $a_k$ and $b_k$ are zero. In this case, $\tilde{e}_k = c_k + C_{k-1}a_{k-1} = c_k$, $e_k = c_k + C_{k-1}a_k = c_k$, $\underline{\tilde{e}}_k = c_{k-N} + C_k b_{k-1} = c_{k-N}$, $\underline{e}_k = c_{k-N} + C_k b_k = c_{k-N}$, $\tilde{K}^\sim_k = m^\sim_k$, and $\underline{S}_k$ are unnecessary.

Thus, Expressions (49), (50), (55), (58), (60), (61), (62) can be organized as follows.

Note that $\mu$ is the laxation factor (the step size), is a real number of $\mu>0$, and is provided in advance.

Note that Expression (56) of $\tilde{e}_k$ and Expression (53) of $\underline{e}_k$ have, in addition to original definitional expressions, theoretically-equivalent multiple expressions, and can be represented as described above. Moreover, in calculation of C-WFHF, the variables (with underscores) relating to backward prediction are not necessarily utilized, and therefore, calculation for these values is unnecessary.

$$\hat{x}_{k|k} = \hat{x}_{k-1|k-1} + \mu \frac{\tilde{K}_k(:, 1)}{R_{e,k}(1, 1)}(y_k - H_k \hat{x}_{k-1|k-1}) \quad (49), (50)$$

$$R_{e,k} = R_{e,k-1} + \frac{c_k c_k^T}{S_{k-1}} - c_{k-N} \tilde{\mu}_k \quad (55)$$

$$\begin{bmatrix} \tilde{K}_k \\ \tilde{\mu}_k \end{bmatrix} = \begin{bmatrix} c_k / S_{k-1} \\ \tilde{K}_{k-1} \end{bmatrix} \quad (58)$$

$$S_k = \rho S_{k-1} + c_k^T W \tilde{c}_k = \rho S_{k-1} + (1 - \gamma_f^{-2})u_k^2 \quad (60)$$

$$\tilde{e}_k = c_k, \quad e_k = c_k, \quad c_k = [u_k \quad u_k]^T \quad (61), (62)$$

Thus, the C-fast $H_\infty$ filter is reduced into the C-whiten fast $H_\infty$ filter of Table 3. Note that $\hat{z}_{k|k} = H_k \hat{x}_{k|k}$ is omitted.

Upon execution of the C-whiten fast $H_\infty$ filter, mathematical expressions of FIG. 11 (Table 3) are calculated from top to bottom (in descending order of an expression number) according to Core Algorithm of FIG. 2. Accordingly, the filter per sample (per unit time) can be executed. This order of expressions is reversed from that described in a general filter. Note that in each table, "Mul." indicates the number of times of integration, and "Add." indicates the number of times of addition.

4.6 C-NLMS Algorithm

FIG. 12 illustrates a table (Table 4) for describing the processing and time complexity of the filter of C-NLMS algorithm.

When $\gamma_f=1.0$ and $\rho=1.0$, $S_k=S_{k-1}=S_{-1}=1/\varepsilon_0$ is satisfied. Thus, the C-whiten fast $H_\infty$ filter is reduced as follows.

$$\hat{x}_{k|k} = \hat{x}_{k-1|k-1} + \mu \frac{\tilde{K}_k(:, 1)}{R_{e,k}(1, 1)}(y_k - H_k \hat{x}_{k-1|k-1}) \quad (49), (50)$$

$$R_{e,k} = R_{e,k-1} + \varepsilon_0 c_k c_k^T - c_{k-N} \tilde{\mu}_k \quad (55)$$

$$\begin{bmatrix} \tilde{K}_k \\ \tilde{\mu}_k \end{bmatrix} = \begin{bmatrix} \varepsilon_0 c_k \\ \tilde{K}_{k-1} \end{bmatrix} \quad (58)$$

This is theoretically equivalent to the NLMS algorithm with a step size of $\mu=1$. Thus, the relaxation factor $\mu$ (a real number of $\mu>0$) is introduced into Expression (49), the C-NLMS algorithm with a step size of $\mu$ as illustrated in Table 4 is obtained. The computational complexity of this algorithm is O(2N). $S_{-1}=1/\varepsilon_0$ is coincident with the regularization term $\delta$ of the NLMS algorithm.

Upon execution of the filter of the C-NLMS algorithm, mathematical expressions of FIG. 12 (Table 4) are calculated from top to bottom (in descending order of an expression number) according to Core Algorithm of FIG. 2. Thus, the filter per sample (per unit time) can be executed. This order of expressions is reversed from that described in a general filter. Note that in each table, "Mul." indicates the number of times of integration, and "Add." indicates the number of times of addition.

4.7 Appropriateness of Whitening of C-fast $H_\infty$ Filter

The fast $H_\infty$ filter can implement the following whitening in such a manner the linear prediction factor of the input signal is brought to zero.

$$\hat{x}_{k|k} = \hat{x}_{k-1|k-1} + \frac{K_k(:, 1)}{1 + \gamma_f^{-2} H_k K_k(:, 1)}(y_k - H_k \hat{x}_{k-1|k-1})$$

$$K_k = \begin{bmatrix} S_k^{-1} c_k^T \\ K_{k-1}(1:N-1, :) \end{bmatrix}$$

$$S_k = \rho S_{k-1} + c_k^T W c_k, \quad c_k = [u_k \quad u_k]^T$$

At this point, $K_{k-1}(1:N-1,:)$ indicates a matrix including first to (N−1)-th rows of $K_{k-1}$.

This whitening fast $H_\infty$ filter (WFHF) is reduced as follows when $\gamma_f=\infty$ is satisfied.

$$\hat{x}_{k|k} = \hat{x}_{k-1|k-1} + K_k(:, 1)(y_k - H_k \hat{x}_{k-1|k-1})$$

$$K_k = \begin{bmatrix} S_k^{-1} c_k^T \\ K_{k-1}(1:N-1, :) \end{bmatrix}$$

$$S_k = \rho S_{k-1} + u_k^2$$

At this point, the regularization term $1+\gamma_f^{-2} H_k K_k(:, 1)$ of the denominator of the filter gain is one. When the amplitude of the input signal $u_k$ is significantly increased, it is assumed that the filter gain becomes too large and whitening becomes unstable (in the case of $\gamma_f<\infty$, the denominator includes $H_k K_k(:, 1)$, and therefore, a gain level is limited). Thus, it is found that there is a problem on whitening of a typical fast $H_\infty$ filter. Moreover, the computational complexity of WFHF is O(3N).

C-WFHF of the aspect of the present disclosure and/or the present embodiment is the technique of solving this problem and properly executing whitening. For whitening, the linear prediction factors $a_k$ and $b_k$ are selectively set to zero from many parameters, for example. Moreover, a proper expression is employed from many mathematical expressions of $\tilde{e}_k$, $e_k$, $\underline{\tilde{e}}_{kN}$, and $\underline{e}_k$. Further, an expression of $\tilde{K}_k = \tilde{m}_k$ is applied, and $S_k$ is unnecessary. As described above, selection of a specific parameter as a specific value from many parameters and application of a specific expression of many expressions to the specific parameter are extremely sophisticated and difficult. Thus, according to the aspect of the present disclosure and/or the present embodiment, whitening can be properly performed.

4.8 Study on Optimal Versions of C-whiten fast $H_\infty$ filter (C-WFHF) and C-NLMS Algorithm (C-NLMS)

Optimization of a calculation expression in the case of considering implementation of C-WFHF and C-NLMS and estimation of a data processing amount have been performed by way of example. Optimization described herein specifically indicates "optimization for incorporation." In this case, obtaining of an expression (a form) for minimizing the number of data processing of an incorporated program is, for example, called optimization. Note that a "form maintaining a relationship with C-FHF" and a "form (an optimal version) suitable for incorporation" are theoretically equivalent to each other. For example, for the "form maintaining the relationship with C-FHF," the meaning of the algorithm thereof is easily understandable. On the other hand, the "form suitable for incorporation" is a form suitable for actual programing for the CPU.

Upon incorporation into a processor such as a digital signal processor (DSP) and hardware, a necessary cycle number varies according to whether an incorporation target is multiplication (Mul.), division (Div.), or addition (Add.). Thus, the cycle number is estimated from the number of times of data processing. Actually, the cycle number to be used greatly changes depending on, reading from a memory or a registry and data processing for parallelization. However, the cycle number was calculated without considering a change in the cycle number due to an incorporation method.

FIG. 15 illustrates a table for describing the processing and time complexity of one example of the optimal version of the C-whiten fast filter.

At this point, Expressions (60), (58), (55), (49), (50) of the C-whiten fast $H_\infty$ filter can be organized as follows. $\tilde{K}_{k-1}$ (1:N−1,1) described herein indicates a matrix of a first column from first to N−1-th rows of $\tilde{K}_{k-1}$.

Note that $\mu$ (the step size, a real number of $\mu$>0) is assigned to the expression of the C-whiten fast $H_\infty$ filter (C-WFHF) of Table 3, and therefore, C-WFHF can be expressed to completely include C-NLMS. Thus, C-NLMS is completely coincident with C-WFHF when $\gamma_f=1$ and $\rho=1$.

An optimization expression described herein is an expression recombined such that the number of times of data processing is decreased, and is theoretically equivalent to an expression before recombination. For example, a N-th component is extracted and utilized from a first component of a first column of Expression (58) of C-WFHF, and in this manner, the following expression of $\tilde{K}_k(:,1)$ is obtained.

$$S_k = \rho S_{k-1} + (1 - \gamma_f^{-2})u_k^2$$

$$\tilde{K}_k(:,1) = \begin{bmatrix} u_k/S_{k-1} \\ \tilde{K}_{k-1}(1:N-1,1) \end{bmatrix}$$

$$R_{e,k}(1,1) = R_{e,k-1}(1,1) + \frac{u_k^2}{S_{k-1}} - u_{k-N}\tilde{K}_{k-1}(N,1)$$

$$\hat{x}_k = \hat{x}_{k-1} + \mu \tilde{K}_k(:,1)\frac{y_k - H_k\hat{x}_{k-1}}{R_{e,k}(1,1)}$$

The following relationship expression is satisfied herein.

$$\frac{c_k c_k^T}{S_{k-1}} = \frac{1}{S_{k-1}}\begin{bmatrix} u_k \\ u_k \end{bmatrix}[u_k \ u_k] = \frac{1}{S_{k-1}}\begin{bmatrix} u_k^2 & u_k^2 \\ u_k^2 & u_k^2 \end{bmatrix}$$

$$c_{k-N}\tilde{\mu}_k = \begin{bmatrix} u_{k-N} \\ u_{k-N} \end{bmatrix}\begin{bmatrix} \frac{u_{k-N}}{S_{k-N-1}} & \frac{u_{k-N}}{S_{k-N-1}} \end{bmatrix} = \frac{1}{S_{k-N-1}}\begin{bmatrix} u_{k-N}^2 & u_{k-N}^2 \\ u_{k-N}^2 & u_{k-N}^2 \end{bmatrix}$$

$$R_{e,k} = R_{e,k-1} + \frac{1}{S_{k-1}}\begin{bmatrix} u_k^2 & u_k^2 \\ u_k^2 & u_k^2 \end{bmatrix} - \frac{1}{S_{k-N-1}}\begin{bmatrix} u_{k-N}^2 & u_{k-N}^2 \\ u_{k-N}^2 & u_{k-N}^2 \end{bmatrix}$$

$$R_{e,k}(1,1) = R_{e,k-1}(1,1) + \frac{u_k^2}{S_{k-1}} - \frac{u_{k-N}^2}{S_{k-N-1}}$$

$$R_{e,k}(1,1) = R_{e,k-1}(1,1) + \frac{u_k^2}{S_{k-1}} - u_{k-N}\frac{u_{k-N}}{S_{k-N-1}}$$

Note that a relationship expression of $\tilde{K}_{k-1}(N,1) = u_{k-N}/S_{k-N-1}$ is derived from Expressions (58), (61), (62) of C-WFHF. Thus, the above-described expression of $R_{e,k}(1,1)$ is derived from Expression (55) of C-WFHF.

Thus, data processing used for actual calculation is for a scalar value in a first row and a first column of $R_{e,k}$, and therefore, Expression (55) of the C-whiten fast $H_\infty$ filter can be omitted as in the above-described expression.

Upon execution of the C-whiten fast $H_\infty$ filter, mathematical expressions in the table are calculated from top to bottom (in descending order of an expression number) according to Core Algorithm of FIG. 2. Thus, the filter per sample (per unit time) can be executed. This order of expressions is reversed from that described in a general filter. Note that in each table, "Mul." indicates the number of times of integration, "Div." indicates the number of times of division, and "Add." indicates the number of times of addition.

As described above, according to such optimization, the computational complexity can be further reduced as compared to the previously-described C-whiten fast $H_\infty$ filter.

FIG. 16 illustrates a table for describing the processing and time complexity of one example of the optimal version of the filter of the C-NLMS algorithm.

In this case, Expressions (58), (55), (49), (50) of the filter of the C-NLMS algorithm can be organized as follows. Note that the N-th component is, for example, extracted and utilized from the first component of the first column of Expression (58) of C-NLMS, and therefore, the following expression of $\tilde{K}_k(:,1)$ is obtained.

$$\tilde{K}_k(:,1) = \begin{bmatrix} \epsilon_0 u_k \\ \tilde{K}_{k-1}(1:N-1,1) \end{bmatrix}$$

$$R_{e,k}(1,1) = R_{e,k-1}(1,1) + \epsilon_0 u_k^2 - u_{k-N}\tilde{K}_{k-1}(N,1)$$

$$\hat{x}_k = \hat{x}_{k-1} + \mu \tilde{K}_k(:,1)\frac{y_k - H_k\hat{x}_{k-1}}{R_{e,k}(1,1)}$$

The following relationship expression is satisfied herein.

$$\epsilon_0 c_k c_k^T = \epsilon_0 \begin{bmatrix} u_k \\ u_k \end{bmatrix} \begin{bmatrix} u_k & u_k \end{bmatrix} = \epsilon_0 \begin{bmatrix} u_k^2 & u_k^2 \\ u_k^2 & u_k^2 \end{bmatrix}$$

$$c_{k-N}\tilde{\mu}_k = \begin{bmatrix} u_{k-N} \\ u_{k-N} \end{bmatrix} \begin{bmatrix} \epsilon_0 u_{k-N} & \epsilon_0 u_{k-N} \end{bmatrix} = \epsilon_0 \begin{bmatrix} u_{k-N}^2 & u_{k-N}^2 \\ u_{k-N}^2 & u_{k-N}^2 \end{bmatrix}$$

$$R_{e,k} = R_{e,k-1} + \epsilon_0 \begin{bmatrix} u_k^2 & u_k^2 \\ u_k^2 & u_k^2 \end{bmatrix} - \epsilon_0 \begin{bmatrix} u_{k-N}^2 & u_{k-N}^2 \\ u_{k-N}^2 & u_{k-N}^2 \end{bmatrix}$$

$$R_{e,k}(1,1) = R_{e,k-1}(1,1) + \epsilon_0 u_k^2 - \epsilon_0 u_{k-N}^2$$

$$R_{e,k}(1,1) = R_{e,k-1}(1,1) + \epsilon_0 u_k^2 - \epsilon_0 u_{k-N} u_{k-N}$$

($\mu$ is the step size and a real number of $\mu$>0)

Note that from Expression (58) of C-NLMS, the following relationship expression is derived:

$$\tilde{K}_{k-1}(N,1) = \epsilon_0 u_{k-N}$$

Thus, from Expression (55) of C-NLMS, the above-described expression of $R_{e,k}(1,1)$ is derived.

Thus, data processing used for actual calculation is for the scalar value in the first row and the first column of $R_{e,k}$, and therefore, Expression (55) of the filter of the C-NLMS algorithm can be omitted as in the above-described expression.

Upon execution of the filter of the C-NLMS algorithm, mathematical expressions in the table are calculated from top to bottom (in descending order of an expression number) according to Core Algorithm of FIG. 2. Thus, the filter per sample (per unit time) can be executed. This order of expressions is reversed from that described in a general filter. Note that in each table, "Mul." indicates the number of times of integration, "Div." indicates the number of times of division, and "Add," indicates the number of times of addition.

As described above, according to one example of optimization, the computational complexity can be further reduced as compared to the previously-described filter of the C-NLMS algorithm. This is coincident with the NLMS algorithm of $\delta = 1/\epsilon_0$.

5. Echo Canceller 5.1 Preparation

Hereinafter, an example of the echo canceller will be described as the embodiment, and operation of the present identification algorithm will be checked. Before starting description, a communication echo canceller will be briefly described. An acoustic echo canceller essential for a recently-focused audio interface such as a smart speaker employs the same principle.

FIG. 4 illustrates a diagram for describing a communication system and echo. For a long-distance phone line such as a line for an International call, a four-wire circuit is used because of a reason such as signal amplification. On the other hand, a subscriber line is for a relatively-short distance, and therefore, a two-wire circuit is used. At a connection portion between the two-wire circuit and the tour-wire circuit, a hybrid transformer is introduced as in FIG. 4, and impedance matching is performed. When such impedance matching is complete, a signal (audio) from a speaker B reaches only a speaker A. However, it is generally difficult to bring complete matching. For this reason, a phenomenon occurs, in which part of a received signal leaks to the four-wire circuit and returns to a transmitter (the speaker B) after having been amplified. This is echo. It is assumed that influence of the echo increases as a transfer distance increases and the quality of call is significantly degraded. Note that in pulse transfer, it is assumed that a problem on degradation of the quality of call due to the echo is caused even at close range.

FIG. 5 illustrates a principle diagram of the echo canceller.

The echo canceller is introduced as in FIG. 5. In this echo canceller, an impulse response of an echo path is sequentially estimated using the directly-observable received signal and echo. Pseudo echo obtained using such a result is subtracted from actual echo to cancel out the echo, and in this manner, the echo is removed.

Estimation of the impulse response of the echo path is performed such that a mean square error of residual echo $e_k$ is minimized. At this point, elements interfering with estimation of the echo path include circuit noise and a signal (audio) from the speaker A. Generally, when two speakers start talking at the same time (double talking), estimation of the impulse response is suspended.

Next, a mathematical model for this echo cancelling problem is produced. First, an observation value $y_k$ of echo $d_k$ is represented by the following expression by means of the impulse response $h_i[k]$ of the echo path, considering that the received signal $u_k$ is a signal input to the echo path.

$$y_k = d_k + v_k = \sum_{i=0}^{N-1} h_i[k] u_{k-i} + v_k, \; k = 0, 1, 2, \ldots \quad (65)$$

At this point, $u_k$ and $y_k$ each indicate the received signal and the observation value of the echo at the time k, and $v_k$ is circuit noise with an average value of 0 at the time k. The tap number N is known. At this point, when an estimation value $\hat{h}_i[k]$ of the impulse response is obtained moment by moment, the pseudo echo is generated as follows by means of such a value.

$$\hat{d}_k = \sum_{i=0}^{N-1} \hat{h}_i[k] u_{k-i}, \; k = 0, 1, 2, \ldots \quad (66)$$

The pseudo echo is subtracted from the echo ($y_k - \hat{d}_k \approx 0$) so that the echo can be cancelled. Note that when k−i<0, $u_{k-i} = 0$ is satisfied.

As described above, the cancelling problem can be reduced to the problem of how to sequentially estimate the impulse response $h_i[k]$ of the echo path from the directly-observable received signal $u_k$ and from the observation value $y_k$ of the directly-observable echo.

Generally, for applying the $H_\infty$ filter to the echo canceller, Expression (65) is first expressed using the state space model including the equation of state and the equation of observation. Thus, $\{h_i[k]\}^{N-1}_{i[<]BEGINITALmo}$ is taken as a state variable $x_k$ to permit a change in the level of $w_k$, and therefore, the following state space model can be established for the echo path.

$$\chi_{k+1} = \chi_k + G_k w_k, \; \chi_k, \; w_k \in \mathcal{R}^N \quad (67)$$

$$y_k = H_k \chi_k + v_k, \; y_k, \; v_k \in \mathcal{R} \quad (68)$$

$$z_k = H_k \chi_k, \; z_k \in \mathcal{R}, \; H_k \in \mathcal{R}^{1 \times N} \quad (69)$$

Note that the following relationship expression is satisfied.

$$\chi_k = [h_0[k], \ldots, h_{N-1}[k]]^T, w_k = [_k(1), \ldots, w_k(N)]^T$$

$$H_k = [u_k, \ldots, u_{k-N+1}]$$

5.2 Checking of Operation

FIG. 13 is a table (Table 5) of the impulse response of the echo path.

Next, using echo path identification propositions, appropriateness of the C-fast filter (C-FHF) is checked, and superiority of the C-fast $H_\infty$ filter (C-FHF) over a fast Kalman filter (FKF) and a fast transversal filter (FTF) is shown. The unknown system is represented by the impulse response $\{h_i(k)\}^{N-1}_{i=0}$ with a length of N=128. The impulse response shifted once at a time of k=4000, and thereafter, held the value. At this point, the observation value $y_k$ of the echo is represented by the following expression.

$$y_k = \sum_{i=0}^{127} h_i u_{k-i} + v_k \tag{70}$$

Note that the value of Table 5 was employed as $\{h_i\}^{23}_{i=0}$, and other values of $\{h_i\}^{127}_{i=24}$ were zero. Moreover, $v_k$ was stationary white Gaussian noise with an average value of 0 and a standard deviation of $\sigma_v = 10^{-40}$.

Moreover, the received signal $u_k$ was approximated using a quadratic AR model as follows:

$$u_k = \alpha_1 u_{k-1} + \alpha_2 u_{k-2} + w'_k \tag{71}$$

Note that $\alpha_1 = 0.7$ and $\alpha_2 = 0.1$ were satisfied, and $w'_k$ was stationary white Gaussian noise with an average value of 0 and a standard deviation of $\sigma_{w'} = 0.02$.

Figure 6B:
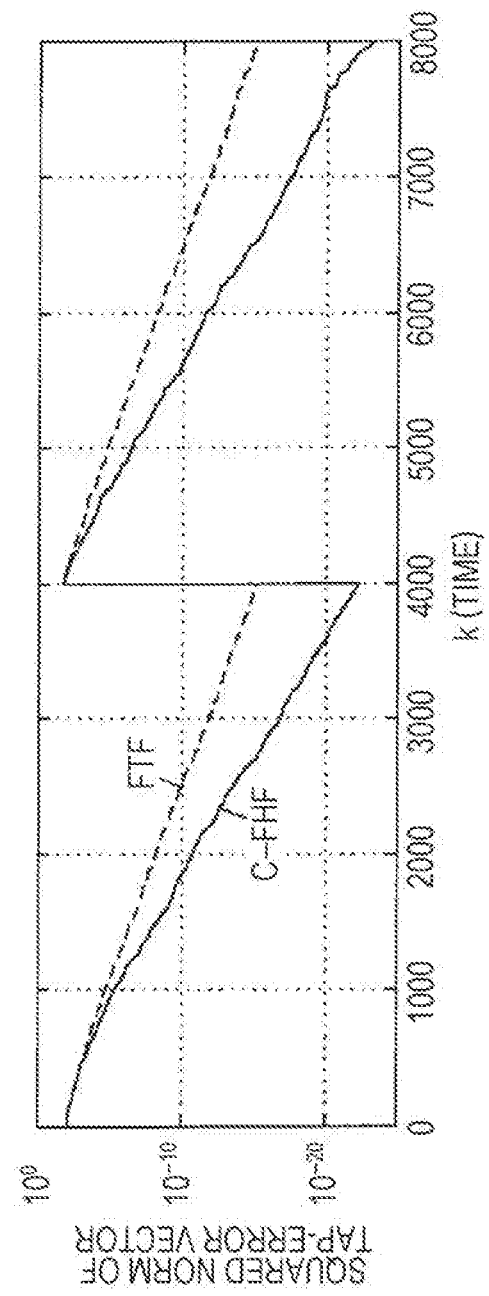

FIGS. 6A and 6B illustrate graphs for describing transition of a tap square error in the present embodiment (C-FHF) and other methods.

FIGS. 6A and 6B illustrate results obtained from comparison of transition of a tap square error $\|\hat{x}_{k|k} - x_k\|^2$ of the C-fast $H_\infty$ filter (C-FHF) with the fast $H_\infty$ filter (FHF), the fast Kalman filter (FKF), and the fast transversal filter (FTF). When $1.3 < \gamma_f < \infty$, there is a computational complexity difference, but there is almost no difference in performance between the fast $H_\infty$ filter (FHF) and the C-fast $H_\infty$ filter (C-FHF). Interestingly, in a case where the observation noise is extremely small as described above, the fast $H_\infty$ filter and the C-fast $H_\infty$ filter exhibited higher convergence performance and higher tracking performance as compared to the fast Kalman filter and the fast transversal filter.

Next, FIG. 7 illustrates a graph for describing an audio signal.

Figure 8A:
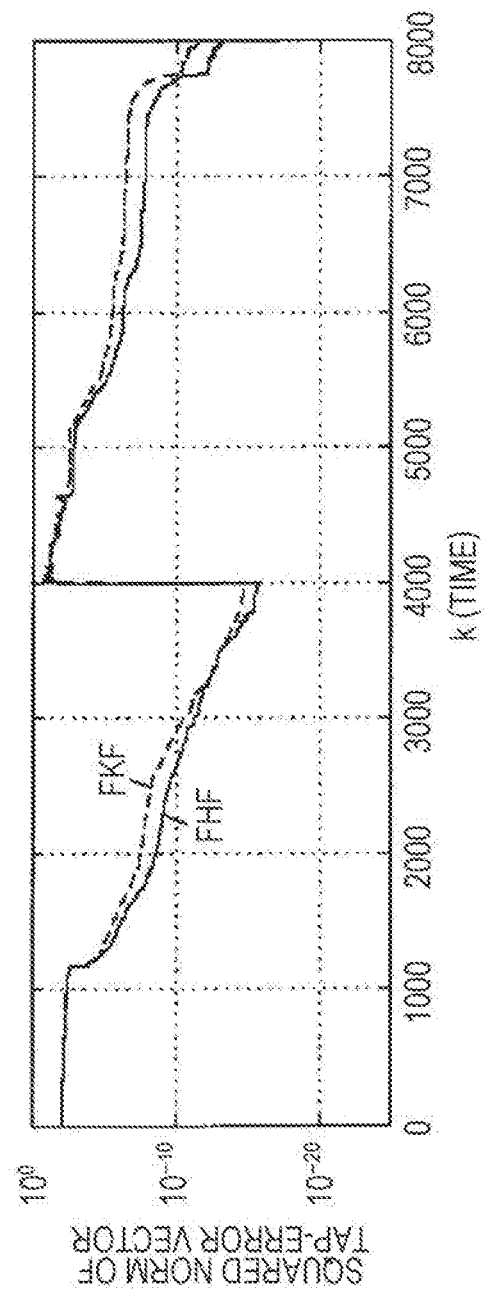
FIGS. 8A and 8B are graphs for describing results when the audio signal of FIG. 7 is taken as input.
Figure 8B:
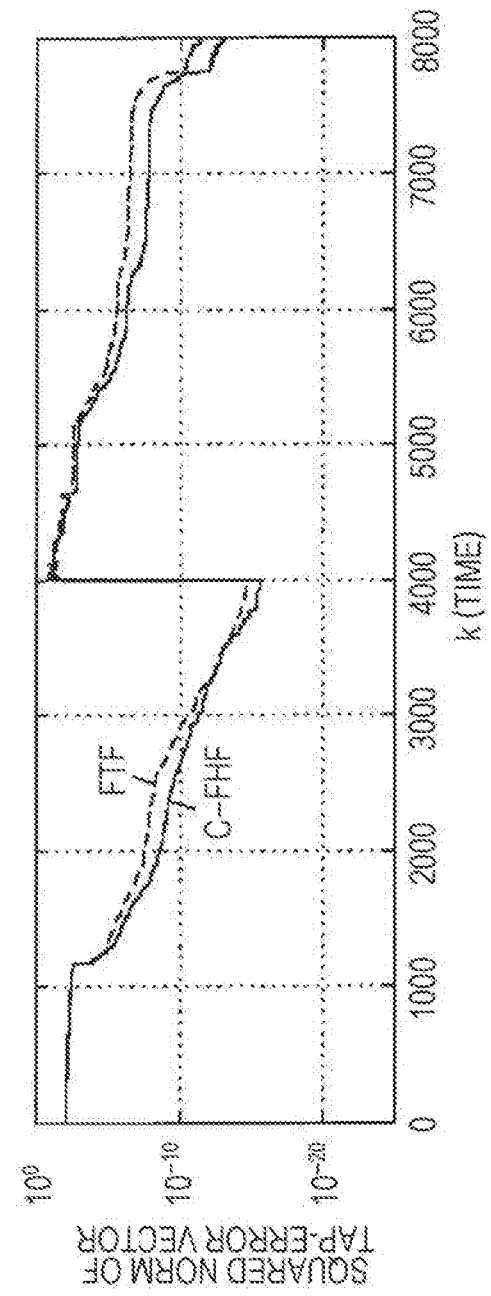

Moreover, FIGS. 8A and 8B illustrate graphs for describing results when the audio signal of FIG. 7 is taken as input.

In this case, the C-fast $H_\infty$ filter also exhibited better convergence performance and better tracking performance as compared to the fast Kalman filter and the fast transversal filter.

6. Proof of Propositions

Hereinafter, proving of each of the above-described propositions will be described.

Proof of First Proposition

The gain matrix $K_k$ can be organized as follows.

$$K_k = Q_k^{-1} C_k^T = (\rho Q_{k-1} + C_k^T W C_k)^{-1} C_k^T \tag{72}$$

$$= \rho^{-1} Q_{k-1}^{-1} C_k^T - \rho^{-1} Q_{k-1}^{-1} C_k^T \times$$

$$(W^{-1} + \rho^{-1} C_k Q_{k-1}^{-1} C_k^T)^{-1} C_k Q_{k-1}^{-1} C_k^T \rho^{-1}$$

$$= \rho^{-1} Q_{k-1}^{-1} C_k^T \times \{I - (W^{-1} + \rho^{-1} C_k Q_{k-1}^{-1} C_k^T)^{-1} C_k Q_{k-1}^{-1} C_k^T \rho^{-1}\}$$

$$= \rho^{-1} Q_{k-1}^{-1} C_k^T (W^{-1} + \rho^{-1} C_k Q_{k-1}^{-1} C_k^T)^{-1} W^{-1}$$

$$= Q_{k-1}^{-1} C_k^T (\rho W^{-1} + C_k Q_{k-1}^{-1} C_k^T)^{-1} W^{-1}$$

$$= \tilde{K}_k R_{e,k}^{-1} W^{-1}$$

Proof of Second Proposition

Using $Q_k = \rho Q_{k-1} + c_k^T W c_k$ and $t_k = \rho t_{k-1} + C_k^T W c_{k-N}$, the expression $Q_{k-1} b_{k-1} = -t_{k-1}$ can be developed as follows.

$$Q_{k-1} b_{k-1} = -t_{k-1} \tag{73}$$

$$(\rho^{-1} Q_k - \rho^{-1} C_k^T W C_k) b_{k-1} = -(\rho^{-1} t_k - \rho^{-1} C_k^T W c_k - N)$$

$$\rho^{-1} Q_k b_{k-1} - \rho^{-1} C_k^T W (C_k b_{k-1} + c_k - N) = -\rho^{-1} t_k$$

$$Q_k b_{k-1} - C_k^T W \tilde{e}_k = -t_k$$

$$Q_k (b_{k-1} - Q_k^{-1} C_k^T W \tilde{e}_k) = -t_k$$

$$Q_k (b_{k-1} - K_k W \tilde{e}_k) = -t_k$$

By comparison of the last expression with $Q_k b_k = -t_k$, the following expression is obtained.

$$b_k = b_{k-1} - K_k W \tilde{e}_k \tag{74}$$

Proof of Third Proposition

Using the first and second propositions, the ex-post backward prediction error $e_k$ can be represented as follows by means of the ex-ante backward prediction error $\tilde{e}_k$.

$$e_k = c_{k-N} + C_k b_k = c_{k-N} + C_k (b_{k-1} - K_k W \tilde{e}_k) \tag{75}$$

$$= (I - C_k K_k W) \tilde{e}_k$$

$$= (I - C_k \tilde{K}_k R_{e,k}^{-1} W^{-1} W) \tilde{e}_k$$

$$= (R_{e,k} - C_k \tilde{K}_k) R_{e,k}^{-1} \tilde{e}_k = R R_{e,k}^{-1} \tilde{e}_k = \rho W^{-1} R_{e,k}^{-1} \tilde{e}_k$$

$$= \chi_k^{-1} \tilde{e}_k$$

Proof of Fourth Proposition

Using the first proposition, the ex-post forward prediction error $e_k$ can be represented as follows by means of the ex-ante forward prediction error $\tilde{e}_k$.

$$e_k = c_k + C_{k-1} a_k = c_k + C_{k-1} (a_{k-1} - K_{k-1} W \tilde{e}_k) \tag{76}$$

$$= (I - C_{k-1} K_{k-1} W) \tilde{e}_k$$

$$= (I - C_{k-1} \tilde{K}_{k-1} R_{e,k-1}^{-1} W^{-1} W) \tilde{e}_k$$

$$= (R_{e,k-1} - C_{k-1} \tilde{K}_{k-1}) R_{e,k-1}^{-1} \tilde{e}_k$$

$$= R R_{e,k-1}^{-1} \tilde{e}_k = \chi_{k-1}^{-1} \tilde{e}_k$$

Proof of Fifth Proposition

Using the first, second, and third propositions, the update expression of the backward linear prediction factor $b_k$ can be rewritten as follows.

$$b_k = b_{k-1} - K_k W \tilde{e}_k = b_{k-1} - \tilde{K}_k R_{e,k}^{-1} W^{-1} W \tilde{e}_k \quad (77)$$
$$= b_{k-1} - \tilde{K}_k R_{e,k}^{-1} \chi_k \underline{e}_k = b_{k-1} - \rho^{-1} \tilde{K}_k W \underline{e}_k$$

Proof of Sixth Proposition

By applying the first and fourth propositions to Expression (29), a new update expression of the forward linear prediction factor $a_k$ is obtained.

Proof of Seventh Proposition

The (N+1)×(N+1) matrix $Q^U_k$ can be resolved into two ways as follows.

$$\tilde{Q}_k = \begin{bmatrix} Q_k & L_k \\ L_k^T & q_k^b \end{bmatrix} = \begin{bmatrix} q_k^f & t_k^T \\ t_k & Q_{k-1} \end{bmatrix} \quad (78)$$

The following expression is obtained in such a manner that matrix inversion lemma is applied to $Q^U_{k-1}$ resolved as described above.

$$\tilde{Q}_{k-1}^{-1} = \begin{bmatrix} Q_{k-1}^{-1} & 0 \\ 0^T & 0 \end{bmatrix} + \frac{1}{S_{k-1}} \begin{bmatrix} b_{k-1} \\ 1 \end{bmatrix} [b_{k-1}^T \ 1] \quad (79)$$
$$= \begin{bmatrix} 0 & 0^T \\ 0 & Q_{k-2}^{-1} \end{bmatrix} + \frac{1}{S_{k-1}} \begin{bmatrix} 1 \\ a_{k-1} \end{bmatrix} [1 \ a_{k-1}^T]$$

Note that the following relationship expression is satisfied.

$$\underline{S}_k = q_k^b + \underline{t}_k^T Q_k^{-1} \underline{t}_k, \ S_k = q_k^f + t_k^T Q_{k-1}^{-1} t_k \quad (80)$$

This expression can be organized as follows in such a manner that both sides of Expression (79) are multiplied by $C^{U\,T}_k$ from the right.

$$\tilde{Q}_{k-1}^{-1} \tilde{C}_k^T = \begin{bmatrix} \tilde{K}_k \\ 0 \end{bmatrix} + \begin{bmatrix} b_{k-1} \\ 1 \end{bmatrix} \frac{\tilde{e}_k^T}{S_{k-1}} \quad (81)$$
$$= \begin{bmatrix} 0 \\ \tilde{K}_{k-1} \end{bmatrix} + \begin{bmatrix} 1 \\ a_{k-1} \end{bmatrix} \frac{\tilde{e}_k^T}{S_{k-1}}$$

Next, the N×2 matrix $\tilde{m}_k$ and the 1×2 matrix $\tilde{\mu}_k$ are defined by Expression (82) below, and therefore. Relationship Expression (83) below is obtained from the last equation of Expression (81).

$$\begin{bmatrix} \tilde{m}_k \\ \tilde{\mu}_k \end{bmatrix} = \begin{bmatrix} 0 \\ \tilde{K}_{k-1} \end{bmatrix} + \begin{bmatrix} 1 \\ a_{k-1} \end{bmatrix} \frac{\tilde{e}_k^T}{S_{k-1}} \quad (82)$$

$$\begin{bmatrix} \tilde{K}_k \\ 0 \end{bmatrix} = \begin{bmatrix} \tilde{m}_k \\ \tilde{\mu}_k \end{bmatrix} - \begin{bmatrix} b_{k-1} \\ 1 \end{bmatrix} \frac{\tilde{e}_k^T}{S_{k-1}} = \begin{bmatrix} \tilde{m}_k - \frac{b_{k-1} \tilde{e}_k^T}{S_{k-1}} \\ \tilde{\mu}_k - \frac{\tilde{e}_k^T}{S_{k-1}} \end{bmatrix} \quad (83)$$

At this point, the following expression s obtained by comparison of each term on both sides of Expression (83).

$$\tilde{K}_k = \tilde{m}_k - b_{k-1} \tilde{\mu}_k \quad (84)$$

Proof of Eighth Proposition

From the second term on both sides of Expression (83), $\tilde{\mu}_k = \tilde{e}^T_k / \underline{S}_{k-1}$ is obtained. Thus, Expression (46) is derived.

Proof of Ninth Proposition

The following expression is obtained in such a manner that both sides of Expression (79) are multiplied by $C^U_k$ and $C^{U\,T}_k$ from both sides.

$$R_{e,k} + \frac{\tilde{e}_k \tilde{e}_k^T}{\underline{S}_{k-1}} = R_{e,k-1} + \frac{\tilde{e}_k \tilde{e}_k^T}{S_{k-1}} \quad (85)$$

By application of the eighth proposition to this expression, the proof completed.

The foregoing detailed description has been presented for the purposes of illustration and description. Many modifications and variations are possible in light of the above teaching. It not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A system identification method for performing fast real-time identification for a system from input/output data, the method comprising:
   estimating a state estimation value $\hat{x}_{k|k}$ of a state $x_k$ of the system from a received signal $u_k$ of an interface in an acoustic system or a communication system and from an observation signal $y_k$ of an echo or a feedback by using a filter robust to disturbance in such a manner that a maximum energy gain from the disturbance to a filter error is, as an evaluation criterion, set smaller than a given upper limit $\gamma_f^2$; and
   canceling out the echo or the feedback using a result of the state estimation value $\hat{x}_{k|k}$, wherein
   the filter is, by Expressions (49) to (62) below, provided to a state space model represented by Expressions (11) to (13) below to estimate the state estimation value $\hat{x}_{k|k}$ of the state $x_k$ of the system:

$$x_{k+1} = x_k + G_k w_k, \ w_k, x_k \in \mathcal{R}^N \quad (11)$$

$$y_k = H_k x_k + v_k, \ y_k, v_k \in \mathcal{R} \quad (12)$$

$$z_k = H_k x_k, \ z_k \in \mathcal{R}, \ H_k \in \mathcal{R}^{1 \times N} \quad (13)$$

$$\hat{x}_{k|k} = \hat{x}_{k-1|k-1} + K_{s,k}(y_k - H_k \hat{x}_{k-1|k-1}) \quad (49)$$

$$K_{s,k} = \frac{\tilde{K}_k(:,1)}{R_{e,k}(1,1)} \quad (50)$$

$$b_k = b_{k-1} - \rho^{-1} \tilde{K}_k W \underline{e}_k \quad (51)$$

$$\underline{S}_k = \rho \underline{S}_{k-1} + \underline{e}_k^T W \tilde{e}_k \quad (52)$$

$$\underline{e}_k = \chi_k^{-1} \tilde{e}_k \quad (53)$$

$$\chi_k = \rho^{-1} R_{e,k} W \quad (54)$$

$$R_{e,k} = R_{e,k-1} + \frac{\tilde{e}_k \tilde{e}_k^T}{\underline{S}_{k-1}} - \tilde{e}_k \tilde{\mu}_k \quad (55)$$

$$\tilde{e}_k = \underline{S}_{k-1} \tilde{\mu}_k^T \quad (56)$$

-continued $$\tilde{K}_k = \tilde{m}_k - b_{k-1}\tilde{\mu}_k \qquad (57)$$

$$\begin{bmatrix} \tilde{m}_k \\ \tilde{\mu}_k \end{bmatrix} = \begin{bmatrix} 0 \\ \tilde{K}_{k-1} \end{bmatrix} + \begin{bmatrix} 1 \\ a_{k-1} \end{bmatrix} \frac{\tilde{e}_k^T}{S_{k-1}} \qquad (58)$$

$$a_k = a_{k-1} - \rho^{-1}\tilde{K}_{k-1}W e_k \qquad (59)$$

$$S_k = \rho S_{k-1} + e_k^T W \tilde{e}_k \qquad (60)$$

$$e_k = \chi_{k-1}^{-1}\tilde{e}_k \qquad (61)$$

$$\tilde{e}_k = c_k + C_{k-1}a_{k-1} \qquad (62)$$

where $C_k$ and $W$ are defined by the following expressions:

$$C_k = \begin{bmatrix} H_k \\ H_k \end{bmatrix}, W = \begin{bmatrix} 1 & 0 \\ 0 & -\gamma_f^2 \end{bmatrix},$$

$c_k \in R^{2 \times 1}$ is a first column vector of $C$ $$\breve{C}_k = \begin{bmatrix} u_k & \cdots & u_{k-N} \\ u_k & \cdots & u_{k-N} \end{bmatrix} \qquad (63)$$

$$\breve{C}_k(:,1) = c_k = [u_k \ u_k]^T, \breve{C}_k(:,i) = \breve{C}_{k-1}(:,i-1), \qquad (64)$$
$i = 2, \ldots, N+1$
$$H_k = [u_k, \ldots, u_{k-N+1}]^T,$$

$x_k$: a state vector or merely a state; unknown, and this is a target for estimation,
$x_0$: an initial state; unknown,
$w_k$: system noise; unknown,
$v_k$: observation noise; unknown,
$y_k$: an observation signal; taken as filter input, and known,
$z_k$: an output signal; unknown,
$G_k$: a drive matrix; known upon execution,
$H_k$: an observation matrix, known,
$\hat{x}_{k|k}$: an estimation value, using observation signals $y_0$ to $y_k$, of the state $x_k$ (an impulse response of an unknown system) at time k; provided by a filter equation,
$\hat{x}_{k+1|k}$: a single-step prediction value, using the observation signals $y_0$ to $y_k$, of a state $x_{k+1}$ at the time k; provided by the filter equation,
$\hat{x}_{-1|-1}$: an initial estimation value of the state; unknown in a normal situation, but zero is used for convenience,
$K_{s,k}$: a filter gain; obtained from a matrix $\hat{\Sigma}_{k|k-1}$,
$R_{e,k}$: an auxiliary variable; a 2×2 matrix,
$\chi_k$: a conversion factor; a 2×2 matrix,
N: a dimension (a tap number) of the state vector; provided in advance,
$\tilde{\mu}_k$: an N+1-th 1×2 row vector of $K^U_k$; obtained by $K^U_k$,
$m_k$: an N×2 matrix including first to N-th rows of $K^U_k$; obtained by $K^U_k$,
W: a weighting matrix; determined by $\gamma_f$,
$a_k$: a forward linear prediction factor; an N-dimensional column vector,
$b_k$: a backward linear prediction factor; an N-dimensional column vector,
$e_k$: an ex-post forward prediction error; a two-dimensional column vector,
$\underline{e}_k$: an ex-post backward prediction error; a two-dimensional column vector, and
$\gamma_f$: an attenuation level; provided upon designing.

2. A system identification method for performing fast real-time identification for a system from input/output data, the method comprising:
estimating a state estimation value $\hat{x}_{k|k}$ of a state $x_k$ of the system from a received signal $u_k$ of an interface in an acoustic system or a communication system and from an observation signal $y_k$ of an echo or a feedback by using a filter robust to disturbance in such a manner that a maximum energy gain from the disturbance to a filter error is, as an evaluation criterion, set smaller than a given upper limit $\gamma_f^2$; and
canceling out the echo or the feedback using a result of the state estimation value $\hat{x}_{k|k}$, wherein
the filter is, by Expressions (49), (50), (55), (58), (60) to (62) below, provided to a state space model represented by Expressions (11) to (13) below to estimate the state estimation value $\hat{x}_{k|k}$ of the state $x_k$ of the system:

$$x_{k+1} = x_k + G_k w_k, w_k, x_k \in \mathcal{R}^N \qquad (11)$$

$$y_k = H_k x_k + v_k, y_k, v_k \in \mathcal{R} \qquad (12)$$

$$z_k = H_k x_k, z_k \in \mathcal{R}, H_k \in \mathcal{R}^{1 \times N} \qquad (13)$$

$$\hat{x}_{k|k} = \hat{x}_{k-1|k-1} + \mu \frac{\tilde{K}_k(:,1)}{R_{e,k}(1,1)}(y_k - H_k \hat{x}_{k-1|k-1}) \qquad (49), (50)$$

$$R_{e,k} = R_{e,k-1} + \frac{c_k c_k^T}{S_{k-1}} - c_{k-N}\tilde{\mu}_k \qquad (55)$$

$$\begin{bmatrix} \tilde{K}_k \\ \tilde{\mu}_k \end{bmatrix} = \begin{bmatrix} c_k / S_{k-1} \\ \tilde{K}_{k-1} \end{bmatrix} \qquad (58)$$

$$S_k = \rho S_{k-1} + c_k^T W \breve{c}_k = \rho S_{k-1} + (1 - \gamma_f^{-2})u_k^2 \qquad (60)$$

$$\tilde{e}_k = c_k, e_k = c_k, c_k = [u_k \ u_k]^T \qquad (61), (62)$$

where $C_k$ and $W$ are defined by the following expressions:

$$C_k = \begin{bmatrix} H_k \\ H_k \end{bmatrix}, W = \begin{bmatrix} 1 & 0 \\ 0 & -\gamma_f^2 \end{bmatrix},$$

$c_k \in R^{2 \times 1}$ is a first column vector of $C_k = [c_k, \ldots, c_{k-N+1}]$, $$\breve{C}_k = \begin{bmatrix} u_k & \cdots & u_{k-N} \\ u_k & \cdots & u_{k-N} \end{bmatrix} \qquad (63)$$

$$\breve{C}_k(:,1) = c_k = [u_k \ u_k]^T, \breve{C}_k(:,i) = \breve{C}_{k-1}(:,i-1),$$
$i = 2, \ldots, N+1$ $$H_k = [u_k, \ldots, u_{k-N+1}]^T, \qquad (64)$$

$x_k$: a state vector or merely a state; unknown, and this is a target for estimation,
$x_0$: an initial state; unknown,
$w_k$: system noise; unknown,
$v_k$: observation noise; unknown,
$y_k$: an observation signal; taken as filter input, and known,
$z_k$: an output signal; unknown,
$G_k$: a drive matrix; known upon execution,
$H_k$: an observation matrix, known,
$\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $K_{s,k}$: a filter gain; obtained from a matrix $\Sigma^{\hat{}}_{k|k-1}$, $R_{e,k}$: an auxiliary variable; a 2×2 matrix, N: a dimension (a tap number) of the state vector; provided in advance, $\tilde{\mu}_k$: an N+1-th 1×2 row vector of $K^U_k$; obtained by $K^U_k$, W: a weighting matrix; determined by $\gamma_f$, $e_k$: an ex-post forward prediction error; a two-dimensional column vector, $\underline{e}_k$: an ex-post backward prediction error; a two-dimensional column vector, $\gamma_f$: an attenuation level; provided upon designing, and μ: a step size (a relaxation factor); a real number of μ>0, and provided in advance.

3. A system identification method for performing fast real-time identification for a system from input/output data, the method comprising:

estimating a state estimation value $\hat{x}_{k|k}$ of a state $x_k$ of the system from a received signal $u_k$ of an interface in an acoustic system or a communication system and from an observation signal $y_k$ of an echo or a feedback by using a filter robust to disturbance in such a manner that a maximum energy gain from the disturbance to a filter error is, as an evaluation criterion, set smaller than a given upper limit $\gamma_f^2$; and canceling out the echo or the feedback using a result of the state estimation value $\hat{x}_{k|k}$, wherein the filter is, by Expressions (49), (50), (55), (58) below, provided to a state space model represented by Expressions (11) to (13) below to estimate the state estimation value $\hat{x}_{k|k}$ of the state $x_k$ of the system:

$$x_{k+1} = x_k + G_k w_k, \quad w_k, x_k \in \mathcal{R}^N \tag{11}$$

$$y_k = H_k x_k + v_k, \quad y_k, v_k \in \mathcal{R} \tag{12}$$

$$z_k = H_k x_k, \quad z_k \in \mathcal{R}, H_k \in \mathcal{R}^{1 \times N} \tag{13}$$

$$\hat{x}_{k|k} = \hat{x}_{k-1|k-1} + \mu \frac{\tilde{K}_k(:,1)}{R_{e,k}(1,1)}(y_k - H_k \hat{x}_{k-1|k-1}) \tag{49), (50}$$

$$R_{e,k} = R_{e,k-1} + \epsilon_0 c_k c_k^T - c_{k-N} \tilde{\mu}_k \tag{55}$$

$$\begin{bmatrix} \tilde{K}_k \\ \tilde{\mu}_k \end{bmatrix} = \begin{bmatrix} \epsilon_0 c_k \\ \tilde{K}_{k-1} \end{bmatrix} \tag{58}$$

where $C_k$ and W are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

$c_k \in R^{2\times 1}$ is a first column vector of $C_k = [c_k, \ldots, c_{k-N+1}]$, $$\check{C}_k = \begin{bmatrix} u_k & \cdots & u_{k-N} \\ u_k & \cdots & u_{k-N} \end{bmatrix} \tag{63}$$

$\check{C}_k(:,1) = c_k = [u_k \; u_k]^T, \check{C}_k(:,i) = \check{C}_{k-1}(:,i-1),$
$i = 2, \ldots, N+1$ $$H_k = [u_k, \ldots, u_{k-N+1}]^T, \tag{64}$$

$x_k$: a state vector or merely a state; unknown, and this is a target for estimation, $x_0$: an initial state; unknown, $w_k$: system noise; unknown, $v_k$: observation noise; unknown, $y_k$: an observation signal; taken as filter input, and known, $z_k$: an output signal; unknown, $G_k$: a drive matrix; known upon execution, $H_k$: an observation matrix, known, $\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $K_{s,k}$: a filter gain; obtained from a matrix $\Sigma^{\hat{}}_{k|k-1}$, $R_{e,k}$: an auxiliary variable; a 2×2 matrix, N: a dimension (a tap number) of the state vector; provided in advance, $\tilde{\mu}_k$: an N+1-th 1×2 row vector of $K^U_k$; obtained by $K^U_k$, W: a weighting matrix; determined by $\gamma_f$, $e_k$: an ex-post forward prediction error; a two-dimensional column vector, $\underline{e}_k$: an ex-post backward prediction error; a two-dimensional column vector, $\epsilon_0$: an optional positive constant; $\epsilon_0 > 0$, and provided in advance, $\gamma_f$: an attenuation level; provided upon designing, and μ: a step size (a relaxation factor); a real number of μ>0, and provided in advance.

4. A system identification device for performing the system identification method according to claim 1, comprising:

a filter robust to disturbance, by setting a maximum energy gain from the disturbance to a filter error, as an evaluation criterion, smaller than a given upper limit $\gamma_f^2$, wherein the filter is, by Expressions (49) to (62) below, provided to a state space model represented by Expressions (11) to (13) below to estimate a state estimation value $\hat{x}_{k|k}$ of a state $x_k$ of the system:

$$x_{k+1} = x_k + G_k w_k, \quad w_k, x_k \in \mathcal{R}^N \tag{11}$$

$$y_k = H_k x_k + v_k, \quad y_k, v_k \in \mathcal{R} \tag{12}$$

$$z_k = H_k x_k, \quad z_k \in \mathcal{R}, H_k \in \mathcal{R}^{1 \times N} \tag{13}$$

$$\hat{x}_{k|k} = \hat{x}_{k-1|k-1} + K_{s,k}(y_k - H_k \hat{x}_{k-1|k-1}) \tag{49}$$

$$K_{s,k} = \frac{\tilde{K}_k(:,1)}{R_{e,k}(1,1)} \tag{50}$$

$$b_k = b_{k-1} - \rho^{-1} \tilde{K}_k W \underline{e}_k \tag{51}$$

$$\underline{S}_k = \rho \underline{S}_{k-1} + \underline{e}_k^T W \underline{\tilde{e}}_k \tag{52}$$

$$\underline{e}_k = \mathcal{X}_k^{-1} \underline{\tilde{e}}_k \tag{53}$$

$$\mathcal{X}_k = \rho^{-1} R_{e,k} W \tag{54}$$

$$R_{e,k} = R_{e,k-1} + \frac{\tilde{e}_k \tilde{e}_k^T}{\underline{S}_{k-1}} - \tilde{e}_k \tilde{\mu}_k \tag{55}$$

-continued $$\tilde{e}_k = S_{k-1}\tilde{\mu}_k^T \quad (56)$$

$$\tilde{K}_k = \tilde{m}_k - b_{k-1}\tilde{\mu}_k \quad (57)$$

$$\begin{bmatrix} \tilde{m}_k \\ \tilde{\mu}_k \end{bmatrix} = \begin{bmatrix} 0 \\ \tilde{K}_{k-1} \end{bmatrix} + \begin{bmatrix} 1 \\ a_{k-1} \end{bmatrix} \frac{\tilde{e}_k^T}{S_{k-1}} \quad (58)$$

$$a_k = a_{k-1} - \rho^{-1}\tilde{K}_k W e_k \quad (59)$$

$$S_k = \rho S_{k-1} + e_k^T W \tilde{e}_k \quad (60)$$

$$e_k = \chi_{k-1}^{-1}\tilde{e}_k \quad (61)$$

$$\tilde{e}_k = c_k + C_{k-1}a_{k-1} \quad (62)$$

where $C_k$ and $W$ are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

$c_k \in R^{2\times 1}$ is a first column vector of $C_k = [c_k, \ldots, c_{k-N+1}]$, $$\check{C}_k = \begin{bmatrix} u_k & \cdots & u_{k-N} \\ u_k & \cdots & u_{k-N} \end{bmatrix} \quad (63)$$

$\check{C}_k(:,1) = c_k = [u_k \ u_k]^T$, $\check{C}_k(:,i) = \check{C}_{k-1}(:,i-1)$,
$i = 2, \ldots, N+1$ $$H_k = [u_k, \ldots, u_{k-N+1}]^T, \quad (64)$$

$x_k$: a state vector or merely a state; unknown, and this is a target for estimation,
$x_0$: an initial state; unknown,
$w_k$: system noise; unknown,
$v_k$: observation noise; unknown,
$y_k$: an observation signal; taken as filter input, and known,
$z_k$: an output signal; unknown,
$G_k$: a drive matrix; known upon execution,
$H_k$: an observation matrix, known,
$\hat{x}_{k|k}$: an estimation value, using observation signals $y_0$ to $y_k$, of the state $x_k$ (an impulse response of an unknown system) at time k; provided by a filter equation,
$\hat{x}_{k+1|k}$: a single-step prediction value, using the observation signals $y_0$ to $y_k$, of a state $x_{k+1}$ at the time k; provided by the filter equation,
$\hat{x}_{-1|-1}$: an initial estimation value of the state; unknown in a normal situation, but zero is used for convenience,
$K_{s,k}$: a filter gain; obtained from a matrix $\hat{\Sigma}_{k|k-1}$,
$R_{e,k}$: an auxiliary variable; a 2×2 matrix,
$\chi_k$: a conversion factor; a 2×2 matrix,
N: a dimension (a tap number) of the state vector; provided in advance,
$\tilde{\mu}_k$: an N+1-th 1×2 row vector of $K^U_k$; obtained by $K^U_k$,
$m_k$: an N×2 matrix including first to N-th rows of $K^U_k$; obtained by $K^U_k$,
W: a weighting matrix; determined by $\gamma_f$,
$a_k$: a forward linear prediction factor; an N-dimensional column vector,
$b_k$: a backward linear prediction factor; an N-dimensional column vector,
$e_k$: an ex-post forward prediction error; a two-dimensional column vector,
$\underline{e}_k$: an ex-post backward prediction error; a two-dimensional column vector, and
$\gamma_f$: an attenuation level; provided upon designing.

5. A system identification device for performing the system identification method according to claim 2, comprising:
a filter robust to disturbance, by setting a maximum energy gain from the disturbance to a filter error, as an evaluation criterion, smaller than a given upper limit $\gamma_f^2$,
wherein the filter is, by Expressions (49), (50), (55), (58), (60) to (62) below, provided to a state space model represented by Expressions (11) to (13) below to estimate a state estimation value $\hat{x}_{k|k}$ of a state $x_k$ of the system:

$$x_{k+1} = x_k + G_k w_k, \quad w_k, x_k \in \mathcal{R}^N \quad (11)$$

$$y_k = H_k x_k + v_k, \quad y_k, v_k \in \mathcal{R} \quad (12)$$

$$z_k = H_k x_k, \quad z_k \in \mathcal{R}, H_k \in \mathcal{R}^{1\times N} \quad (13)$$

$$\hat{x}_{k|k} = \hat{x}_{k-1|k-1} + \mu \frac{\tilde{K}_k(:,1)}{R_{e,k}(1,1)}(y_k - H_k \hat{x}_{k-1|k-1}) \quad (49), (50)$$

$$R_{e,k} = R_{e,k-1} + \frac{c_k c_k^T}{S_{k-1}} - c_{k-N}\tilde{\mu}_k \quad (55)$$

$$\begin{bmatrix} \tilde{K}_k \\ \tilde{\mu}_k \end{bmatrix} = \begin{bmatrix} c_k/S_{k-1} \\ \tilde{K}_{k-1} \end{bmatrix} \quad (58)$$

$$S_k = \rho S_{k-1} + c_k^T W \tilde{c}_k = \rho S_{k-1} + (1 - \gamma_f^{-2})u_k^2 \quad (60)$$

$$\tilde{e}_k = c_k, \quad e_k = c_k, \quad c_k = [u_k \ u_k]^T \quad (61), (62)$$

where $C_k$ and $W$ are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

$c_k \in R^{2\times 1}$ is a first column vector of $C_k = [c_k, \ldots, c_{k-N+1}]$, $$\check{C}_k = \begin{bmatrix} u_k & \cdots & u_{k-N} \\ u_k & \cdots & u_{k-N} \end{bmatrix} \quad (63)$$

$\check{C}_k(:,1) = c_k = [u_k \ u_k]^T$, $\check{C}_k(:,i) = \check{C}_{k-1}(:,i-1)$,
$i = 2, \ldots, N+1$ $$H_k = [u_k, \ldots, u_{k-N+1}]^T, \quad (64)$$

$x_k$: a state vector or merely a state; unknown, and this is a target for estimation,
$x_0$: an initial state; unknown,
$w_k$: system noise; unknown,
$v_k$: observation noise; unknown,
$y_k$: an observation signal; taken as filter input, and known,
$z_k$: an output signal; unknown,
$G_k$: a drive matrix; known upon execution,
$H_k$: an observation matrix, known,
$\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $K_{s,k}$: a filter gain; obtained from a matrix $\Sigma^{\wedge}_{k|k-1}$, $R_{e,k}$: an auxiliary variable; a 2×2 matrix, N: a dimension (a tap number) of the state vector; provided in advance, $\tilde{\mu}_k$: an N+1-th 1×2 row vector of $K^U_k$; obtained by $K^U_k$, W: a weighting matrix; determined by $\gamma_f$, $e_k$: an ex-post forward prediction error; a two-dimensional column vector, $\underline{e}_k$: an ex-post backward prediction error; a two-dimensional column vector, $\gamma_f$: an attenuation level; provided upon designing, and μ: a step size (a relaxation factor); a real number of μ>0, and provided in advance.

6. The system identification device according to claim 5, wherein
for Expressions (58), (55), (49), (50), the following expressions modified from Expressions (58), (55), (49), (50) are used according to Expression (60):

$$S_k = \rho S_{k-1} + (1 - \gamma_f^{-2})u_k^2$$

$$\tilde{K}_k(:, 1) = \begin{bmatrix} u_k/S_{k-1} \\ \tilde{K}_{k-1}(1:N-1, 1) \end{bmatrix}$$

$$R_{e,k}(1, 1) = R_{e,k-1}(1, 1) + \frac{u_k^2}{S_{k-1}} - u_{k-N}\tilde{K}_{k-1}(N, 1)$$

$$\hat{x}_k = \hat{x}_{k-1} + \mu \tilde{K}_k(:, 1)\frac{y_k - H_k \hat{x}_{k-1}}{R_{e,k}(1, 1)}$$

where μ is the step size and a real number of μ>0.

7. The system identification device according to claim 5, wherein
the filter sets $\gamma_f=1.0$, $\rho=1.0$, $S_k=S_{k-1}=S_{-1}=1/\varepsilon_0$ to use degenerated expressions including Expressions (49), (50), (55), (58) below for the state space model represented by Expressions (11) to (13) below:

$$x_{k+1} = x_k + G_k w_k, \quad w_k, x_k \in \mathcal{R}^N \tag{11}$$

$$y_k = H_k x_k + v_k, \quad y_k, v_k \in \mathcal{R} \tag{12}$$

$$z_k = H_k x_k, \quad z_k \in \mathcal{R}, H_k \in \mathcal{R}^{1 \times N} \tag{13}$$

$$\hat{x}_{k|k} = \hat{x}_{k-1|k-1} + \mu \frac{\tilde{K}_k(:, 1)}{R_{e,k}(1, 1)}(y_k - H_k \hat{x}_{k-1|k-1}) \tag{49), (50}$$

$$R_{e,k} = R_{e,k-1} + \varepsilon_0 c_k c_k^T - c_{k-N} \tilde{\mu}_k \tag{55}$$

$$\begin{bmatrix} \tilde{K}_k \\ \tilde{\mu}_k \end{bmatrix} = \begin{bmatrix} \varepsilon_0 c_k \\ \tilde{K}_{k-1} \end{bmatrix} \tag{58}$$

where $C_k$ and W are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

$c_k \in R^{2 \times 1}$ is a first column vector of $C_k = [c_k, \ldots, c_{k-N+1}]$, $$\check{C}_k = \begin{bmatrix} u_k & \cdots & u_{k-N} \\ u_k & \cdots & u_{k-N} \end{bmatrix} \tag{63}$$

$$\check{C}_k(:, 1) = c_k = [u_k \quad u_k]^T, \check{C}_k(:, i) = \check{C}_{k-1}(:, i-1),$$
$$i = 2, \ldots, N+1$$

$$H_k = [u_k, \ldots, u_{k-N+1}]^T, \tag{64}$$

$\varepsilon_0$: an optional positive constant; $\varepsilon_0 > 0$, and provided in advance, and μ: the step size (the relaxation factor); a real number of μ>0, and provided in advance.

8. A system identification device for performing the system identification method according to claim 3, comprising:
a filter robust to disturbance, by setting a maximum energy gain from the disturbance to a filter error, as an evaluation criterion, smaller than a given upper limit $\gamma_f^2$,
wherein the filter is, by Expressions (49), (50), (55), (58) below, provided to a state space model represented by Expressions (11) to (13) below to estimate a state estimation value $\hat{x}_{k|k}$ of a state $x_k$ of the system:

$$x_{k+1} = x_k + G_k w_k, \quad w_k, x_k \in \mathcal{R}^N \tag{11}$$

$$y_k = H_k x_k + v_k, \quad y_k, v_k \in \mathcal{R} \tag{12}$$

$$z_k = H_k x_k, \quad z_k \in \mathcal{R}, H_k \in \mathcal{R}^{1 \times N} \tag{13}$$

$$\hat{x}_{k|k} = \hat{x}_{k-1|k-1} + \mu \frac{\tilde{K}_k(:, 1)}{R_{e,k}(1, 1)}(y_k - H_k \hat{x}_{k-1|k-1}) \tag{49), (50}$$

$$R_{e,k} = R_{e,k-1} + \varepsilon_0 c_k c_k^T - c_{k-N} \tilde{\mu}_k \tag{55}$$

$$\begin{bmatrix} \tilde{K}_k \\ \tilde{\mu}_k \end{bmatrix} = \begin{bmatrix} \varepsilon_0 c_k \\ \tilde{K}_{k-1} \end{bmatrix} \tag{58}$$

where $C_k$ and W are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

$c_k \in R^{2 \times 1}$ is a first column vector of $C_k = [c_k, \ldots, c_{k-N+1}]$, $$\check{C}_k = \begin{bmatrix} u_k & \cdots & u_{k-N} \\ u_k & \cdots & u_{k-N} \end{bmatrix} \tag{63}$$

$$\check{C}_k(:, 1) = c_k = [u_k \quad u_k]^T, \check{C}_k(:, i) = \check{C}_{k-1}(:, i-1), \tag{64}$$
$$i = 2, \ldots, N+1$$

$$H_k = [u_k, \ldots, u_{k-N+1}]^T,$$

$x_k$: a state vector or merely a state; unknown, and this is a target for estimation, $x_0$: an initial state; unknown, $w_k$: system noise; unknown, $v_k$: observation noise; unknown, $y_k$: an observation signal; taken as filter input, and known, $z_k$: an output signal; unknown, $G_k$: a drive matrix; known upon execution, $H_k$: an observation matrix, known, $\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $K_{s,k}$: a filter gain; obtained from a matrix $\Sigma^{\wedge}_{k|k-1}$, $R_{e,k}$: an auxiliary variable; a 2×2 matrix, N: a dimension (a tap number) of the state vector; provided in advance, $\tilde{\mu}_k$: an N+1-th 1×2 row vector of $K^U_k$; obtained by $K^U_k$, W: a weighting matrix; determined by $\gamma_f$, $e_k$: an ex-post forward prediction error; a two-dimensional column vector, $\underline{e}_k$: an ex-post backward prediction error; a two-dimensional column vector, $\epsilon_0$: an optional positive constant; $\epsilon_0 > 0$, and provided in advance, $\gamma_f$: an attenuation level; provided upon designing, and $\mu$: a step size (a relaxation factor); a real number of $\mu > 0$, and provided in advance.

9. The system identification device according to claim 8, wherein for Expressions (58), (55), (49), (50), the following expressions modified from Expressions (58), (55), (49), (50) are used:

$$\tilde{K}_k(:,1) = \begin{bmatrix} \epsilon_0 u_k \\ \tilde{K}_{k-1}(1:N-1,1) \end{bmatrix}$$

$$R_{e,k}(1.1) = R_{e,k-1}(1.1) + \epsilon_0 u_k^2 - u_{k-N}\tilde{K}_{k-1}(N,1)$$

$$\hat{x}_k = \hat{x}_{k-1} + \mu \tilde{K}_k(:,1)\frac{y_k - H_k \hat{x}_{k-1}}{R_{e,k}(1,1)}$$

where $\mu$ is the step size and a real number of $\mu > 0$.

10. The system identification device according to claim 4, further comprising:

a processing section configured to execute the filter, wherein the processing section performs a first step of reading an initial state of a recursive expression from a storage section or receiving the initial state from an input section or an interface section, thereby initializing a recursive variable of the filter, a second step of determining whether or not the time k exceeds a preset data length L, thereby initializing and restarting the filter gain or terminating processing when the time k exceeds the data length L, a third step of receiving, when the time k is equal to or less than the data length L, an input signal $u_k$ from the input section or the interface section or reading the input signal $u_k$ from the storage section, thereby updating an augmented observation matrix $C^U_k$ by means of the input signal $u_k$ and a shift characteristic $C^U_k = [c_k, C_{k-1}] = [C_k, c_{k-N}]$, a fourth step of executing a filter algorithm per unit time, the filter algorithm including processing of calculating the expressions for providing the filter with a second term on a right-hand side of Expression (49) and a relaxation factor $\mu$ ($\mu$ is a real number of $\mu > 0$) in descending order from Expression (62) to Expression (49), a fifth step of updating a filter equation including Expression (49) and storing the state estimation value $\hat{x}_{k|k}$ in the storage section and/or outputting the state estimation value $\hat{x}_{k|k}$ from an output section or the interface section, and a sixth step of advancing the time k and repeating the processing of the first to fourth steps.

11. The system identification device according to claim 7, further comprising:

a processing section configured to execute the filter, wherein the processing section performs a first step of reading an initial state of a recursive expression from a storage section or receiving the initial state from an input section or an interface section, thereby initializing a recursive variable of the filter, a second step of determining whether or not the time k exceeds a preset data length L, thereby initializing and restarting the filter gain or terminating processing when the time k exceeds the data length L, a third step of receiving, when the time k is equal to or less than the data length L, an input signal $u_k$ from the input section or the interface section or reading the input signal $u_k$ from the storage section, thereby updating an augmented observation matrix $C^U_k$ by means of the input signal $u_k$ and a shift characteristic $C^U_k = [c_k, C_{k-1}] = [C_k, c_{k-N}]$, a fourth step of executing a filter algorithm per unit step size, the filter algorithm including processing of calculating the expressions for providing the filter with Expression (49) and the step size $\mu$ ($\mu$ is a real number of $\mu > 0$) in descending order from Expression (58) to Expression (49), a fifth step of updating a filter equation including Expression (49) and storing the state estimation value $\hat{x}_{k|k}$ in the storage section and/or outputting the state estimation value $\hat{x}_{k|k}$ from an output section or the interface section, and a sixth step of advancing the time k and repeating the processing of the first to fourth steps.

12. The system identification device according to claim 4, wherein the evaluation criterion satisfies Expression (14) below for the state space model:

$$\sup_{x_0,\{w_i\},\{v_i\}} \frac{\sum_{i=0}^{k} \|e_{f,i}\|^2/\rho}{\|x_0 - \breve{x}_0\|^2_{\Sigma_0^{-1}} + \sum_{i=0}^{k} \|w_i\|^2 + \sum_{i=0}^{k} \|v_i\|^2/\rho} < \gamma_f^2 \quad (14)$$

where $e_{f,i}$: a filter error; $e_{f,i} = z^v_{i|i} - H_i x_i$, $z^v_{i|i}$ is an output estimation value $H_i \hat{x}_{i|i}$, $\Sigma_0^{-1}$: an inverse matrix of a weighting matrix representing uncertainty of the state; $\Sigma_0$ is known, $\rho$: a forgetting factor; when $\gamma_f$ is determined, determined by $\rho = 1 - \chi(\gamma_f)$, and can be also determined independently of $\gamma_f$, and $\gamma_f$: the attenuation level; provided upon designing.

13. The system identification device according to claim 10, wherein the processing section of the filter executes, at the third step, a step of determining a scalar existence condition of an expression below before or after execution of the processing, and when Expression (30) is not satisfied, terminates or restarts the processing:

$$-\theta \hat{\Xi}_i + \rho \gamma_f^2 > 0, \ i=0, \ldots, k \tag{30}$$

where $\theta$, $\hat{\Xi}_i$ are defined by expressions below:

$$\varrho = 1 - \gamma_f^2, \ \hat{\Xi}_i = \frac{\rho H_i K_{s,i}}{1 - H_i K_{s,i}} = \frac{\rho H_i K_i(:,1)}{1 - (1 - \gamma_f^{-2}) H_i K_i(:,1)} \tag{31}$$

14. The system identification device according to claim 10, wherein
the processing section of the filter further calculates, at the fifth step, an output estimation value $z^v_{k|k}, z^v_{k|k-1}$ according to Expression (48) below, thereby storing the output estimation value in a storage section and/or outputting the output estimation value from the output section or an interface section:

$$\hat{z}_{k|k} = H_k \hat{x}_{k|k} \tag{48}$$

where $\hat{z}_{k|k}$: an estimation value $H_k \hat{x}_{k|k}$, using the observation signals $y_0$ to $y_k$, of output $z_k$ at the time k; provided by the filter equation, and
$\hat{z}_{k|k-1}$: a single-step prediction value $H_k \hat{x}_{k-1|k-1}$, using the observation signals $y_0$ to $y_{k-1}$, of the output $z_k$ at the time k; provided by the filter equation.

15. The system identification device according to claim 4, wherein
the filter is applied to obtain the state estimation value $\hat{x}_{k|k}$, and
pseudo echo $\hat{d}k$ is estimated as in Expression (66) below, and is subtracted from echo to cancel the echo:

$$\hat{d}_k = \sum_{i=0}^{N-1} \hat{h}_i[k] u_{k-i}, \ k = 0, 1, 2, \ldots \tag{66}$$

where $[\hat{h}_0[k], \ldots, \hat{h}_{N-1}[k]]^T$ is $\hat{x}_{k-1|k-1}$ to $\hat{x}_{k|k}$, $u_k$ is a reception signal at time $t_k$ ($=kT$; T is a sampling cycle), and N is the tap number (known).

16. A non-transitory computer-readable recording medium recording a system identification program for causing a computer to execute the system identification method according to claim 1, wherein
the system identification program causes the computer to execute
a step of providing, by a processing section, a filter to a state space model represented by Expressions (11) to (13) below according to Expressions (49) to (62) below,
a step of reading, by the processing section, an initial state of a recursive expression from a storage section or receiving the initial state from an input section or an interface section, thereby initializing a recursive variable of the filter,
a step of setting, by the processing section, the filter such that a maximum energy gain from disturbance to a filter error is, as an evaluation criterion, set smaller than a given upper limit $\gamma_f^2$ to provide a filter robust to the disturbance and calculating the expressions for providing the filter in descending order to estimate a state estimate value $\hat{x}_{k|k}$ of a state $x_k$ of the system, and
a step of storing, by the processing section, the state estimate value $\hat{x}_{k|k}$ in the storage section and/or outputting the state estimate value $\hat{x}_{k|k}$ from an output section or the interface section:

$$x_{k+1} = x_k + G_k w_k, \ w_k. x_k \in \mathcal{R}^N \tag{11}$$

$$y_k = H_k x_k + v_k, \ y_k, v_k \in \mathcal{R} \tag{12}$$

$$z_k = H_k x_k, \ z_k \in \mathcal{R}, \ H_k \in \mathcal{R}^{1 \times N} \tag{13}$$

$$\hat{x}_{k|k} = \hat{x}_{k-1|k-1} + K_{s,k}(y_k - H_k \hat{x}_{k-1|k-1}) \tag{49}$$

$$K_{s,k} = \frac{\tilde{K}_k(:,1)}{R_{e,k}(1,1)} \tag{50}$$

$$b_k = b_{k-1} - \rho^{-1} \tilde{K}_k W \underline{e}_k \tag{51}$$

$$\underline{S}_k = \rho \underline{S}_{k-1} + \underline{e}_k^T W \tilde{\underline{e}}_k \tag{52}$$

$$\underline{e}_k = \chi_k^{-1} \hat{\underline{e}}_k \tag{53}$$

$$\chi_k = \rho^{-1} R_{e,k} W \tag{54}$$

$$R_{e,k} = R_{e,k-1} + \frac{\tilde{e}_k \tilde{e}_k^T}{S_{k-1}} - \tilde{e}_k \tilde{\mu}_k \tag{55}$$

$$\hat{\underline{e}}_k = S_{k-1} \tilde{\mu}_k^T \tag{56}$$

$$\tilde{K}_k = \tilde{m}_k - b_{k-1} \tilde{\mu}_k \tag{57}$$

$$\begin{bmatrix} \tilde{m}_k \\ \tilde{\mu}_k \end{bmatrix} = \begin{bmatrix} 0 \\ \tilde{K}_{k-1} \end{bmatrix} - \begin{bmatrix} 1 \\ a_{k-1} \end{bmatrix} \frac{\tilde{e}_k^T}{S_{k-1}} \tag{58}$$

$$a_k = a_{k-1} - \rho^{-1} \tilde{K}_{k-1} W e_k \tag{59}$$

$$S_k = \rho S_{k-1} + e_k^T W \tilde{e}_k \tag{60}$$

$$e_k = \chi_{k-1}^{-1} \tilde{e}_k \tag{61}$$

$$\tilde{e}_k = c_k + C_{k-1} a_{k-1} \tag{62}$$

where $C_k$ and W are defined by the following expressions:

$$C_k = \begin{bmatrix} H_k \\ H_k \end{bmatrix}, \ W = \begin{bmatrix} 1 & 0 \\ 0 & -\gamma_f^{-2} \end{bmatrix},$$

$c_k \in \mathcal{R}^{2 \times 1}$ is a first column vector of $C_k = [c_k, \ldots, c_{k-N+1}]$, $$\breve{C}_k = \begin{bmatrix} u_k & \ldots & u_{k-N} \\ u_k & \ldots & u_{k-N} \end{bmatrix} \tag{63}$$

$$\breve{C}_k(:,1) = c_k = [u_k \ u_k]^T, \ \breve{C}_k(:,i) = \breve{C}_{k-1}(:,i-1), \tag{64}$$
$i = 2, \ldots, N+1$
$H_k = [u_k, \ldots, u_{k-N+1}]^T,$ $x_k$: a state vector or merely a state; unknown, and this is a target for estimation,
$x_0$: an initial state; unknown,
$w_k$: system noise; unknown,
$v_k$: observation noise; unknown,
$y_k$: an observation signal; taken as filter input, and known,
$z_k$: an output signal; unknown,
$G_k$: a drive matrix; known upon execution,
$H_k$: an observation matrix, known, $\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $K_{s,k}$: a filter gain; obtained from a matrix $\hat{\Sigma}_{k|k-1}$, $R_{e,k}$: an auxiliary variable; a 2×2 matrix, $\chi_k$: a conversion factor; a 2×2 matrix, N: a dimension (a tap number) of the state vector; provided in advance, $\tilde{\mu}_k$: an N+1-th 1×2 row vector of $K^U_k$; obtained by $K^U_k$, $m_k$: an N×2 matrix including first to N-th rows of $K^U_k$; obtained by $K^U_k$, W: a weighting matrix; determined by $\gamma_f$, $a_k$: a forward linear prediction factor; an N-dimensional column vector, $b_k$: a backward linear prediction factor; an N-dimensional column vector, $e_k$: an ex-post forward prediction error; a two-dimensional column vector, $\underline{e}_k$: an ex-post backward prediction error; a two-dimensional column vector, and $\gamma_f$: an attenuation level; provided upon designing.

17. A non-transitory computer-readable recording medium recording a system identification program for causing a computer to execute the system identification method according to claim 2, wherein the system identification program causes the computer to execute a step of providing, by a processing section, a filter to a state space model represented by Expressions (11) to (13) below according to Expressions (49), (50), (55), (58), (60) to (62) below, a step of reading, by the processing section, an initial state of a recursive expression from a storage section or receiving the initial state from an input section or an interface section, thereby initializing a recursive variable of the filter, a step of setting, by the processing section, the filter such that a maximum energy gain from disturbance to a filter error is, as an evaluation criterion, set smaller than a given upper limit $\gamma_f^2$ to provide a filter robust to the disturbance and calculating the expressions for providing the filter in descending order to estimate a state estimate value $\hat{x}_{k|k}$ of a state $x_k$ of the system, and a step of storing, by the processing section, the state estimate value $\hat{x}_{k|k}$ in the storage section and/or outputting the state estimate value $\hat{x}_{k|k}$ from an output section or the interface section:

$$x_{k+1} = x_k + G_k w_k, w_k, x_k \in \mathcal{R}^N \tag{11}$$

$$y_k = H_k x_k + v_k, y_k, v_k \in \mathcal{R} \tag{12}$$

$$z_k = H_k x_k, z_k \in \mathcal{R}, H_k \in \mathcal{R}^{1 \times N} \tag{13}$$

$$\hat{x}_{k|k} = \hat{x}_{k-1|k-1} + \mu \frac{\tilde{K}_k(:,1)}{R_{e,k}(1,1)}(y_k - H_k \hat{x}_{k-1|k-1}) \tag{49}, (50)$$

$$R_{e,k} = R_{e,k-1} + \frac{c_k c_k^T}{S_{k-1}} - c_{k-N}\tilde{\mu}_k \tag{55}$$

-continued $$\begin{bmatrix} \tilde{K}_k \\ \tilde{\mu}_k \end{bmatrix} = \begin{bmatrix} c_k/S_{k-1} \\ \tilde{K}_{k-1} \end{bmatrix} \tag{58}$$

$$S_k = \rho S_{k-1} + c_k^T W \check{c}_k = \rho S_{k-1} + (1 - \gamma_f^{-2})u_k^2 \tag{60}$$

$$\tilde{e}_k = c_k, e_k = c_k, c_k = [u_k \ u_k]^T \tag{61}, (62)$$

where $C_k$ and W are defined by the following expressions:

$$C_k = \begin{bmatrix} H_k \\ H_k \end{bmatrix}, W = \begin{bmatrix} 1 & 0 \\ 0 & -\gamma_f^{-2} \end{bmatrix},$$

$c_k \in R^{2 \times 1}$ is a first column vector of $C_k = [c_k, \ldots, c_{k-N+1}]$, $$\check{C}_k = \begin{bmatrix} u_k & \cdots & u_{k-N} \\ u_k & \cdots & u_{k-N} \end{bmatrix} \tag{63}$$

$$\check{C}_k(:,1) = c_k = [u_k \ u_k]^T, \check{C}_k(:,i) = \check{C}_{k-1}(:,i-1), \tag{64}$$
$i = 2, \ldots, N+1$
$H_k = [u_k, \ldots, u_{k-N+1}]^T,$ $H_k = [\mu_k, \ldots, u_{k-N+1}]^T$, $x_k$: a state vector or merely a state; unknown, and this is a target for estimation, $x_0$: an initial state; unknown, $w_k$: system noise; unknown, $v_k$: observation noise; unknown, $y_k$: an observation signal; taken as filter input, and known, $z_k$: an output signal; unknown, $G_k$: a drive matrix; known upon execution, $H_k$: an observation matrix, known, $\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $K_{s,k}$: a filter gain; obtained from a matrix $\hat{\Sigma}_{k|k-1}$, $R_{e,k}$: an auxiliary variable; a 2×2 matrix, N: a dimension (a tap number) of the state vector; provided in advance, $\tilde{\mu}_k$: an N+1-th 1×2 row vector of $K^U_k$; obtained by $K^U_k$, W: a weighting matrix; determined by $\gamma_f$, $e_k$: an ex-post forward prediction error; a two-dimensional column vector, $\underline{e}_k$: an ex-post backward prediction error; a two-dimensional column vector, $\gamma_f$: an attenuation level; provided upon designing, and $\mu$: a step size (a relaxation factor); a real number of $\mu > 0$, and provided in advance.

18. A non-transitory computer-readable recording medium recording a system identification program for causing a computer to execute the system identification method according to claim 3, wherein the system identification program causes the computer to execute a step of providing, by a processing section, a filter to a state space model represented by Expressions (11) to (13) below according to Expressions (49), (50), (55), (58) below, a step of reading, by the processing section, an initial state of a recursive expression from a storage section or receiving the initial state from an input section or an interface section, thereby initializing a recursive variable of the filter, a step of setting, by the processing section, the filter such that a maximum energy gain from disturbance to a filter error is, as an evaluation criterion, set smaller than a given upper limit $\gamma_f^2$ to provide a filter robust to the disturbance and calculating the expressions for providing the filter in descending order to estimate a state estimate value $\hat{x}_{k|k}$ of a state $x_k$ of the system, and a step of storing, by the processing section, the state estimate value $\hat{x}_{k|k}$ in the storage section and/or outputting the state estimate value $\hat{x}_{k|k}$ from an output section or the interface section:

$$x_{k+1} = x_k + G_k w_k, w_k, x_k \in \mathcal{R}^N \quad (11)$$

$$y_k = H_k x_k + v_k, y_k, v_k \in \mathcal{R} \quad (12)$$

$$z_k = H_k x_k, z_k \in \mathcal{R}, H_k \in \mathcal{R}^{1 \times N} \quad (13)$$

$$\hat{x}_{k|k} = \hat{x}_{k-1|k-1} + \mu \frac{\tilde{K}_k(:,1)}{R_{e,k}(1.1)}(y_k - H_k \hat{x}_{k-1|k-1}) \quad (49), (50)$$

$$R_{e,k} = R_{e,k-1} + \epsilon_0 c_k c_k^T - c_{k-N} \tilde{\mu}_k \quad (55)$$

$$\begin{bmatrix} \tilde{K}_k \\ \tilde{\mu}_k \end{bmatrix} = \begin{bmatrix} \epsilon_0 c_k \\ \tilde{K}_{k-1} \end{bmatrix} \quad (58)$$

where $C_k$ and $W$ are defined by the following expressions:

$$C_k = \begin{bmatrix} H_k \\ H_k \end{bmatrix}, W = \begin{bmatrix} 1 & 0 \\ 0 & -\gamma_f^2 \end{bmatrix},$$

$c_k \in R^{2 \times 1}$ is a first column vector of $C_k = [c_k, \ldots, c_{k-N+1}]$, $$\breve{C}_k = \begin{bmatrix} u_k & \cdots & u_{k-N} \\ u_k & \cdots & u_{k-N} \end{bmatrix} \quad (63)$$

$$\breve{C}_k(:,1) = c_k = [u_k \quad u_k]^T, \breve{C}_k(:,i) = \breve{C}_{k-1}(:,i-1), \quad (64)$$
$$i = 2, \ldots, N+1$$
$$H_k = [u_k, \ldots, u_{k-N+1}]^T,$$

$x_k$: a state vector or merely a state; unknown, and this is a target for estimation, $x_0$: an initial state; unknown, $w_k$: system noise; unknown, $v_k$: observation noise; unknown, $y_k$: an observation signal; taken as filter input, and known, $z_k$: an output signal; unknown, $G_k$: a drive matrix; known upon execution, $H_k$: an observation matrix, known, $\hat{x}_{k|k}$: an estimation value, using observation signals $y_0$ to $y_k$, of the state $x_k$ (an impulse response of an unknown system) at time k; provided by a filter equation, $\hat{x}_{k+1|k}$: a single-step prediction value, using the observation signals $y_0$ to $y_k$, of a state $x_{k+1}$ at the time k; provided by the filter equation, $\hat{x}_{-1|-1}$: an initial estimation value of the state; unknown in a normal situation, but zero is used for convenience, $K_{s,k}$: a filter gain; obtained from a matrix $\Sigma^{\wedge}_{k|k-1}$, $R_{e,k}$: an auxiliary variable; a 2×2 matrix, N: a dimension (a tap number) of the state vector; provided in advance, $\tilde{\mu}_k$: an N+1-th 1×2 row vector of $K^U_k$; obtained by $K^U_k$, W: a weighting matrix; determined by $\gamma_f$, $e_k$: an ex-post forward prediction error; a two-dimensional column vector, $\underline{e}_k$: an ex-post backward prediction error; a two-dimensional column vector, $\epsilon_0$: an optional positive constant; $\epsilon_0 > 0$, and provided in advance, $\gamma_f$: an attenuation level; provided upon designing, and $\mu$: a step size (a relaxation factor); a real number of $\mu > 0$, and provided in advance.

* * * * *